United States Patent
Braddell et al.

(10) Patent No.: US 11,967,799 B2
(45) Date of Patent: Apr. 23, 2024

(54) SPECTROSCOPIC DETECTION USING A TUNABLE FREQUENCY COMB

(71) Applicant: PILOT PHOTONICS LIMITED, Glasnevin (IE)

(72) Inventors: Jules Braddell, Maynooth (IE); Frank Smyth, Castleknock (IE)

(73) Assignee: Pilot Photonics Limited, Dublin (IE)

( * ) Notice: Subject to any disclaimer, the term of this patent is extended or adjusted under 35 U.S.C. 154(b) by 0 days.

(21) Appl. No.: 15/508,889

(22) PCT Filed: Aug. 28, 2015

(86) PCT No.: PCT/EP2015/069764
§ 371 (c)(1),
(2) Date: Apr. 14, 2017

(87) PCT Pub. No.: WO2016/034511
PCT Pub. Date: Mar. 10, 2016

(65) Prior Publication Data
US 2017/0256909 A1 Sep. 7, 2017

(30) Foreign Application Priority Data
Sep. 5, 2014 (EP) .................................. 14183741.9

(51) Int. Cl.
*H01S 5/065* (2006.01)
*G01J 3/10* (2006.01)
(Continued)

(52) U.S. Cl.
CPC .............. *H01S 5/0656* (2013.01); *G01J 3/10* (2013.01); *G01J 3/42* (2013.01); *G01N 21/3504* (2013.01);
(Continued)

(58) Field of Classification Search
CPC .............. G01J 3/42; G01N 2021/3133; G01N 2021/3148; G01N 2021/399; G01N 2021/451; G01N 21/3504
See application file for complete search history.

(56) References Cited

U.S. PATENT DOCUMENTS 4,998,017 A * 3/1991 Ryan ........................ G01J 3/26
250/343
5,957,858 A * 9/1999 Micheels ........... G01N 21/3504
250/339.03
(Continued)

FOREIGN PATENT DOCUMENTS

WO WO2013037819 3/2013

OTHER PUBLICATIONS

Anandarajah, Prince M., et al. "Flexible optical comb source for super channel systems." Optical Fiber Communication Conference. Optica Publishing Group, 2013. (Year: 2013).*
(Continued)

*Primary Examiner* — Rufus L Phillips
(74) *Attorney, Agent, or Firm* — Anthony G. Smyth; LOZA & LOZA, LLP

(57) ABSTRACT

A method of performing spectroscopic measurements provides an optical frequency comb, and directs the comb through or at a sample. The optical frequency comb is generated by gain switching a laser diode constructed from Gallium Nitride and related materials. Various techniques are described for manipulating the comb source to achieve desired benefits for spectroscopy.

43 Claims, 16 Drawing Sheets

(51) Int. Cl.
*G01J 3/42* (2006.01)
*G01N 21/31* (2006.01)
*G01N 21/3504* (2014.01)
*G01N 21/39* (2006.01)
*G01N 21/45* (2006.01)
*H01S 5/00* (2006.01)
*H01S 5/042* (2006.01)
*H01S 5/10* (2021.01)
*H01S 5/40* (2006.01)

(52) U.S. Cl.
CPC .......... *H01S 5/0064* (2013.01); *H01S 5/0085* (2013.01); *H01S 5/0427* (2013.01); *H01S 5/1096* (2013.01); *H01S 5/4006* (2013.01); *G01N 2021/3133* (2013.01); *G01N 2021/3148* (2013.01); *G01N 2021/399* (2013.01); *G01N 2021/451* (2013.01); *G01N 2201/0612* (2013.01)

(56) References Cited

U.S. PATENT DOCUMENTS

| | | | | |
|---|---|---|---|---|
| 6,008,931 A | * | 12/1999 | von Helmolt | G01J 9/02 359/326 |
| 2008/0074660 A1 | | 3/2008 | Ye | |
| 2008/0111077 A1 | * | 5/2008 | Miller | G01N 21/39 250/339.07 |
| 2011/0267625 A1 | * | 11/2011 | Guelachvili | G01J 3/453 356/454 |
| 2012/0063476 A1 | * | 3/2012 | Anandarajah | H01S 5/0687 372/28 |
| 2012/0133931 A1 | | 5/2012 | Fermann et al. | |
| 2015/0276587 A1 | * | 10/2015 | Cowie | G01N 21/39 356/437 |

OTHER PUBLICATIONS

Serrano et al. "VCSEL-based optical frequency combs: Toward efficient single-device comb generation." IEEE Photonics Tech. Letters vol. 25:20 (Oct. 15, 2013).

Diddams, "The evolving optical frequency comb [Invited]." J. Optical Society of America vol. 27:11 (Nov. 2010).

Heras et al. "Subpicometer wavelength accuracy with gain-switched laser diode in high-resolution optical spectrometry." Optics Express Optical Soc. of America vol. 16:14 (Jul. 7, 2008).

PCT/EP2015069764. Int'l Search Report & Written Opinion (dated May 1, 2016).

* cited by examiner

Gain Switched Fabry-Perot Laser diode Comb Generation

Embodiment A – Spectral absorption measured by a multi-pass sample cell and a dispersive element

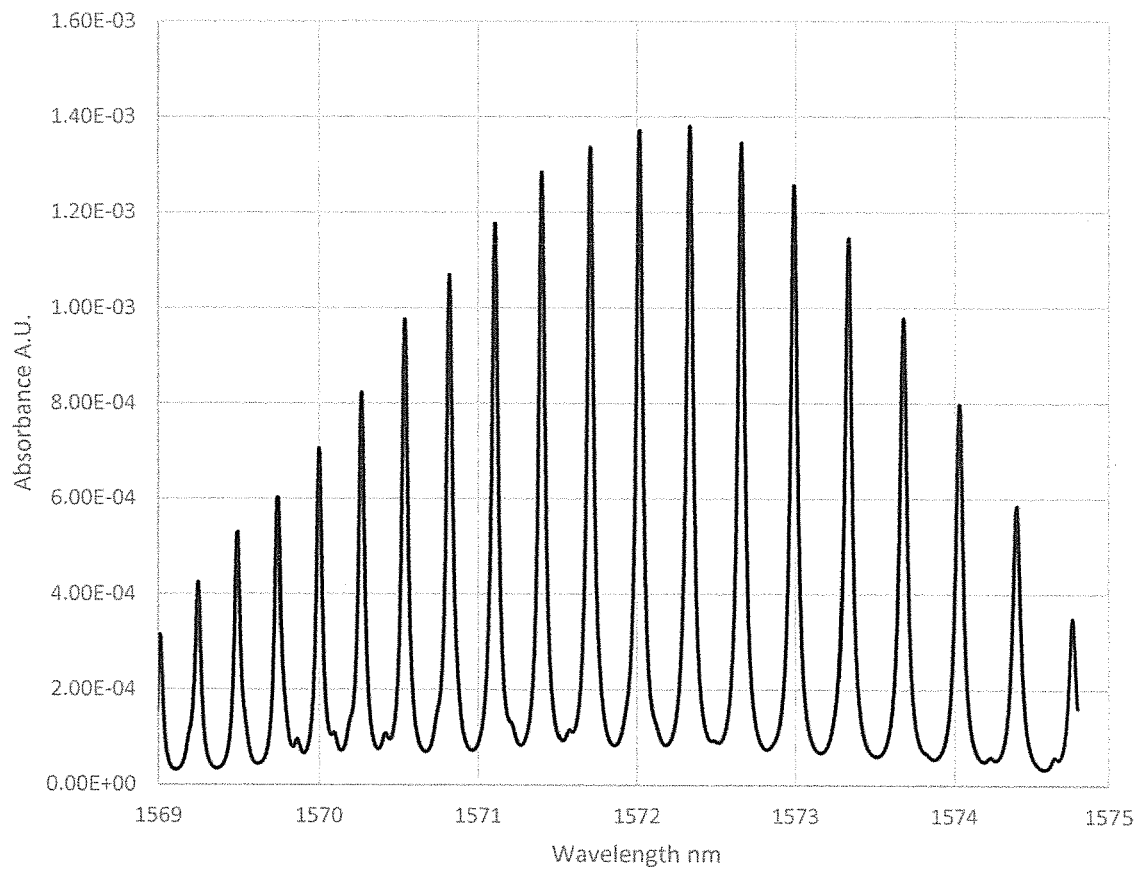
Fig. 3 $CO_2$ Absorption spectrum around 1572 nm
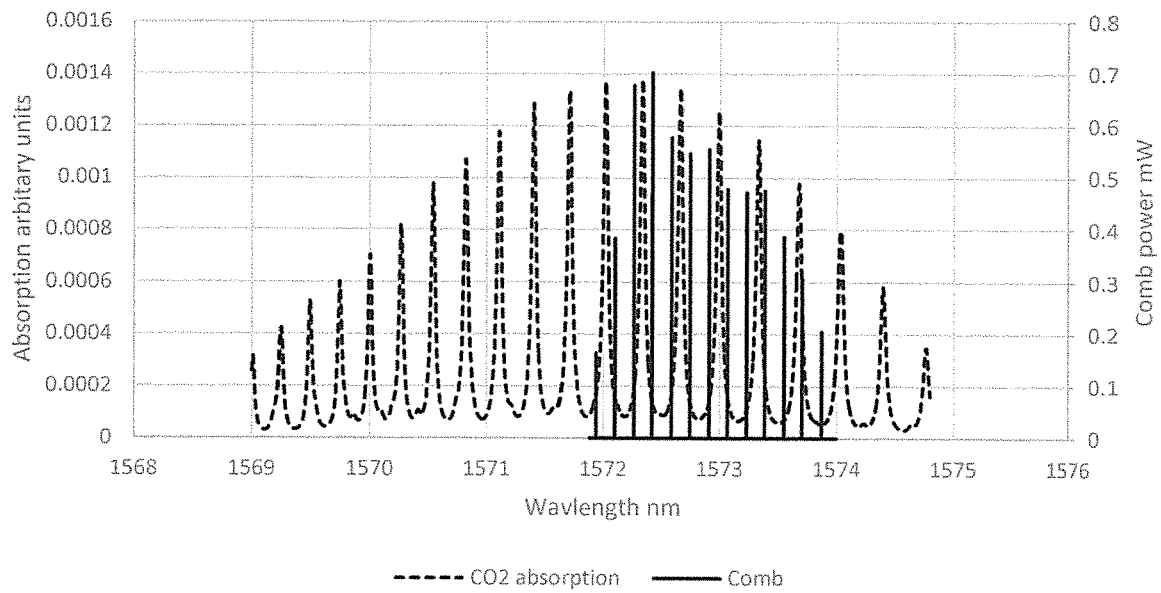
Fig. 4 CO2 absorption with laser frequency comb in the minimum absorption position

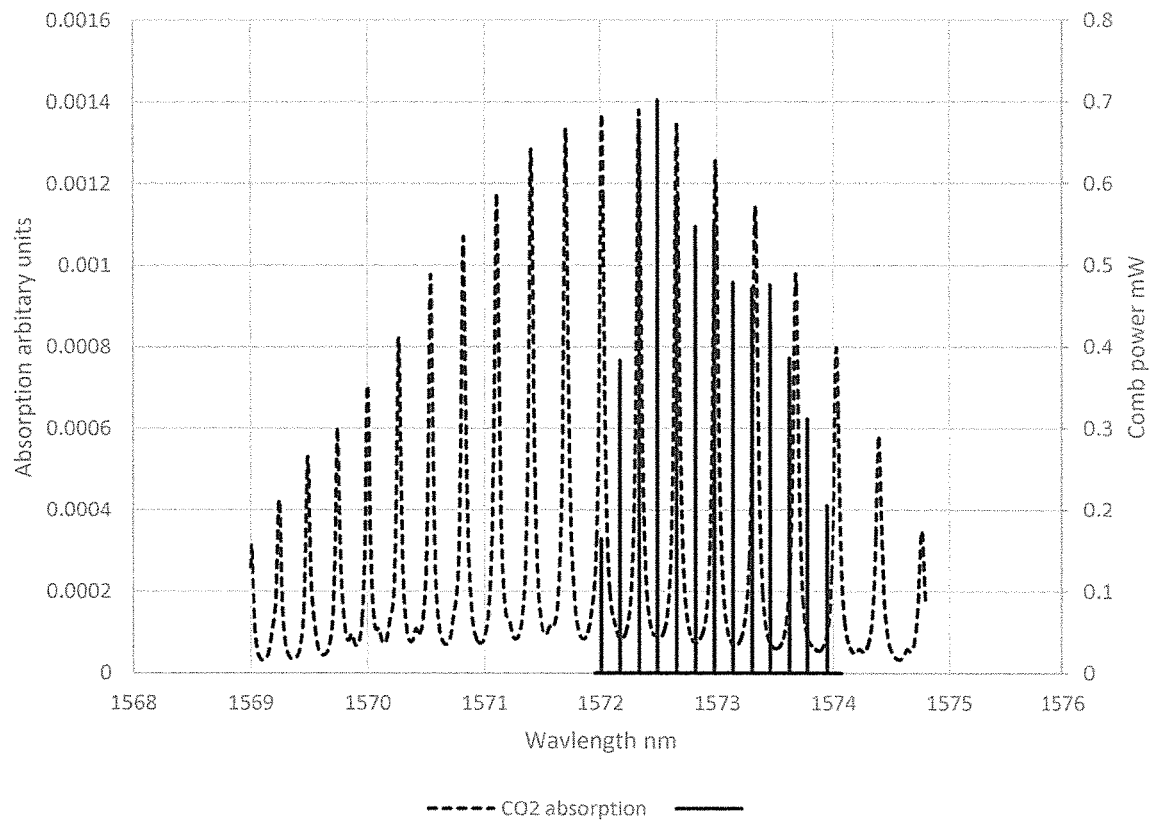
Fig. 5 CO2 absorption with laser frequency comb in the maximum absorption position
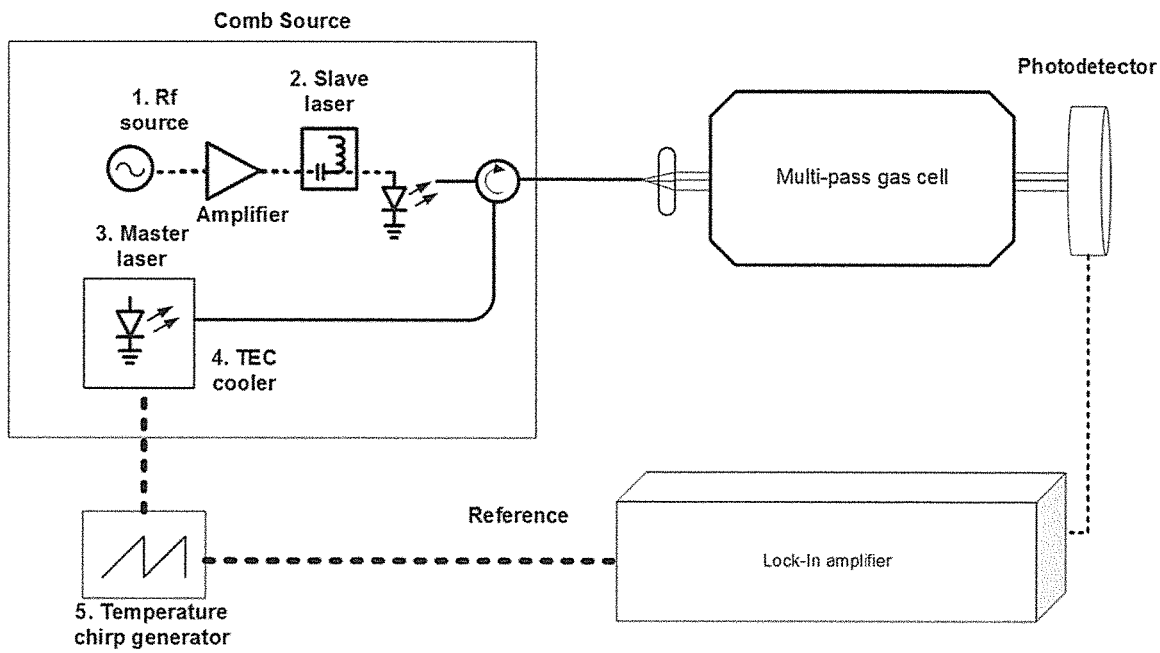
Fig. 6 Embodiment B

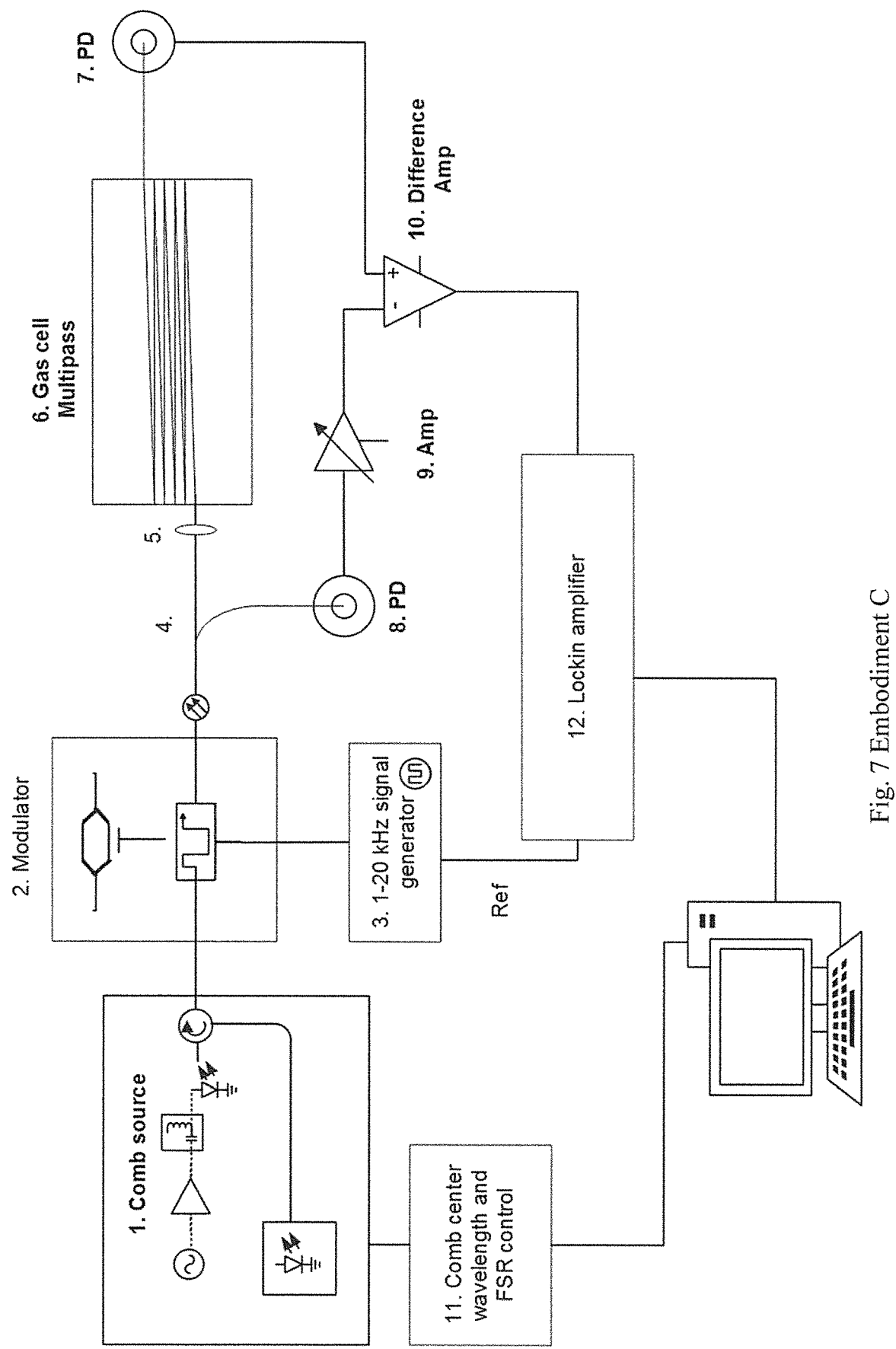
Fig. 7 Embodiment C

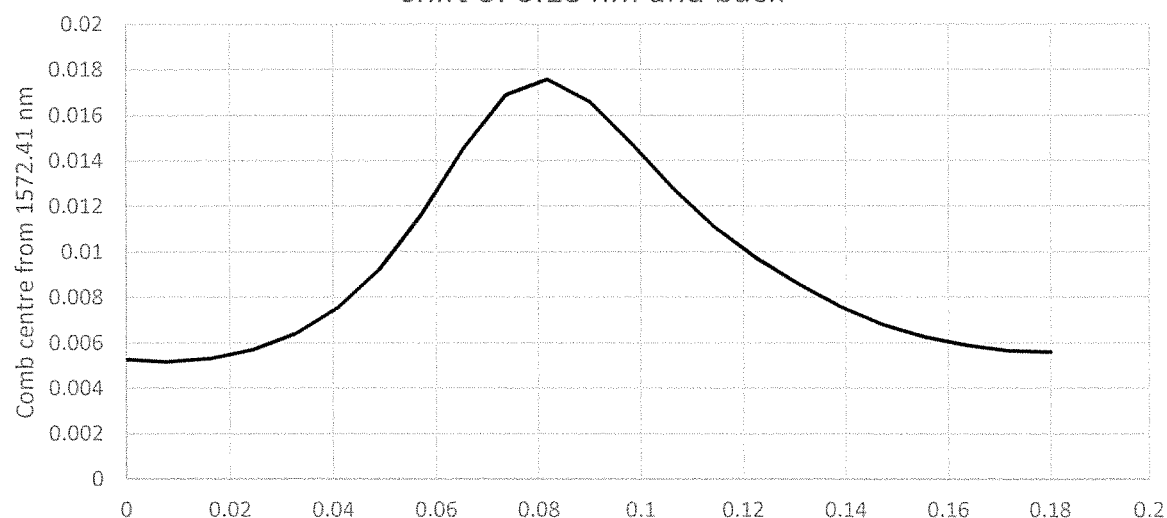
Fig. 8 Shift in Absorption from Cell during a centre wavelength shift of 0.18 nm and back
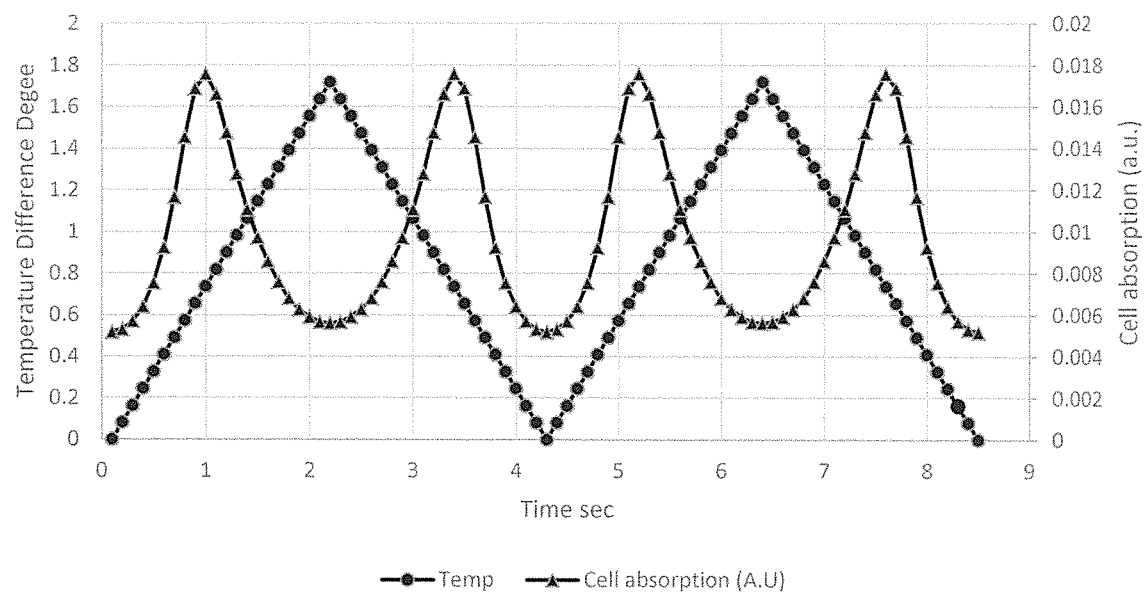
Fig. 9 Periodic ramp in temperature of master/slave LD causing change in cell absoption correspond to maximum/minimum absorption of $CO_2$ around 1.572 um

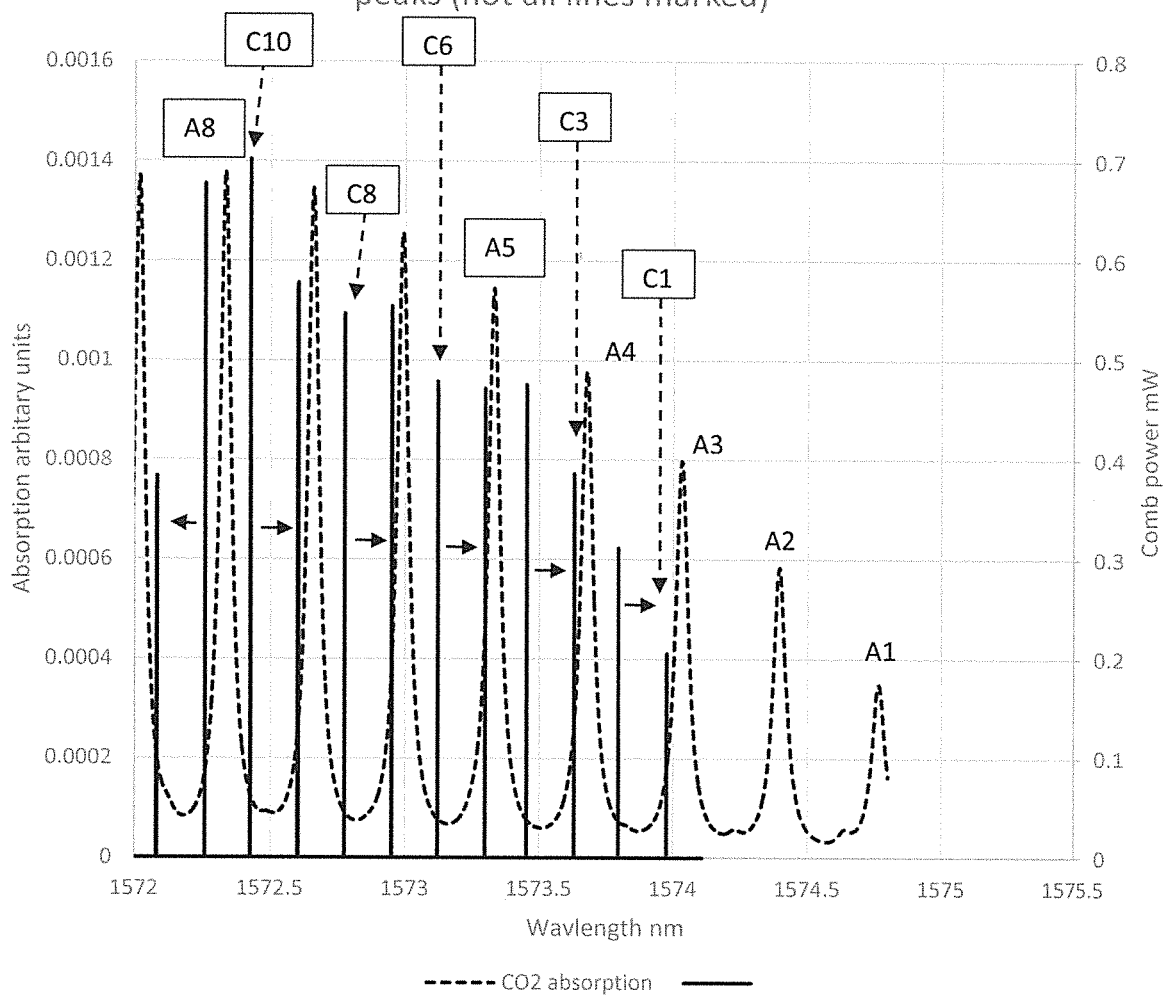
Fig. 10 Comb in Minimum position at 19.846 GHz before FSR sweep showing nomenclature of comb lines and absorption peaks (not all lines marked)

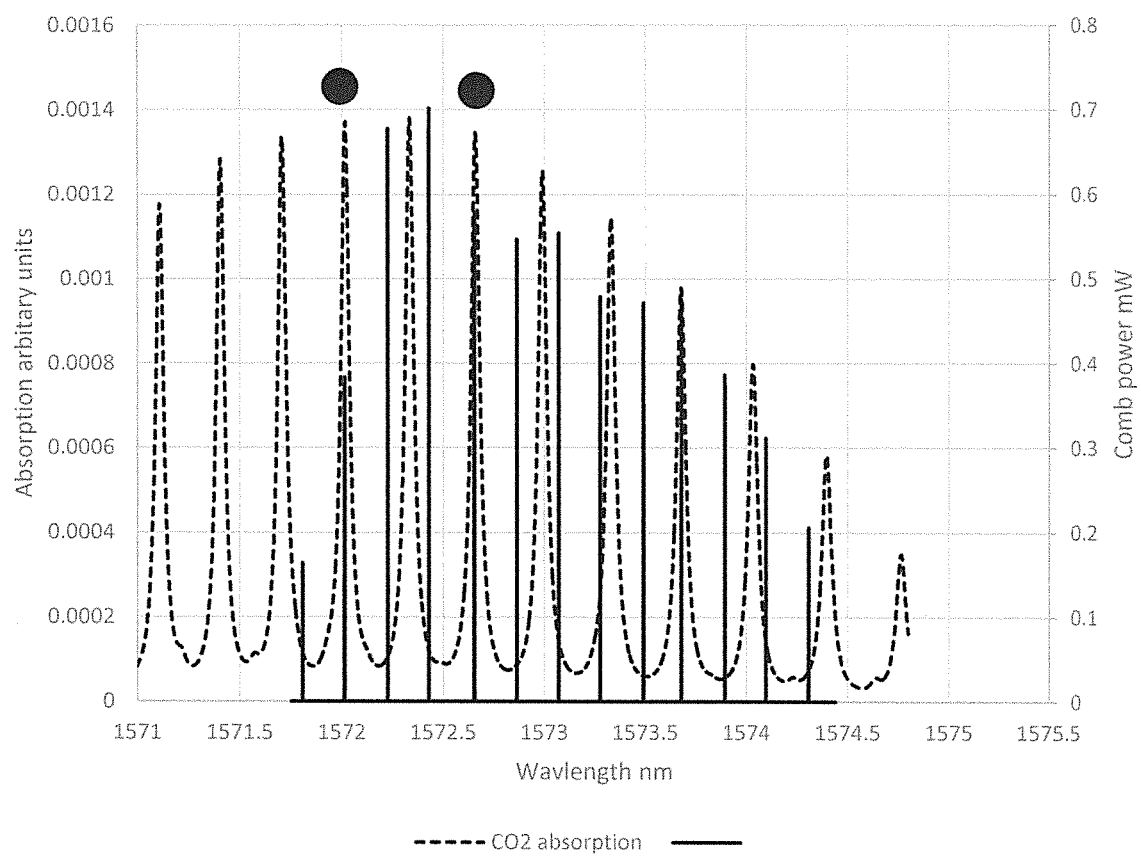
Fig. 11 FSR increased to show to resonance of two central absorption peaks with comb lines as occurs at 19.486 GHz + 5.595 GHz FSR increase. Overlapping peaks C9 with A7 and C12 with A9 cause peak in absorption

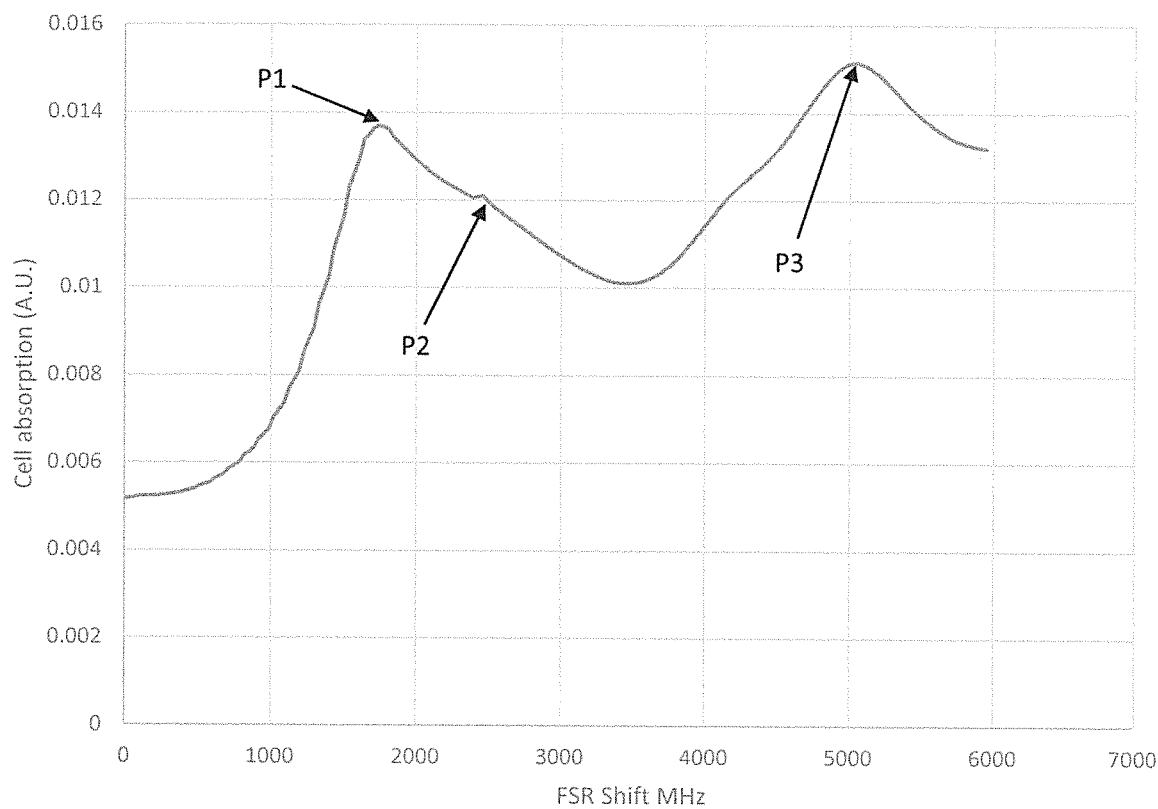
Fig. 12 Multipass cell absorption as FSR is ramped from 19.46 to 25.46 GHz keeping center wavelength constant showing 3 Distinct peaks caused by overlap of comb lines and $CO_2$ absorption lines

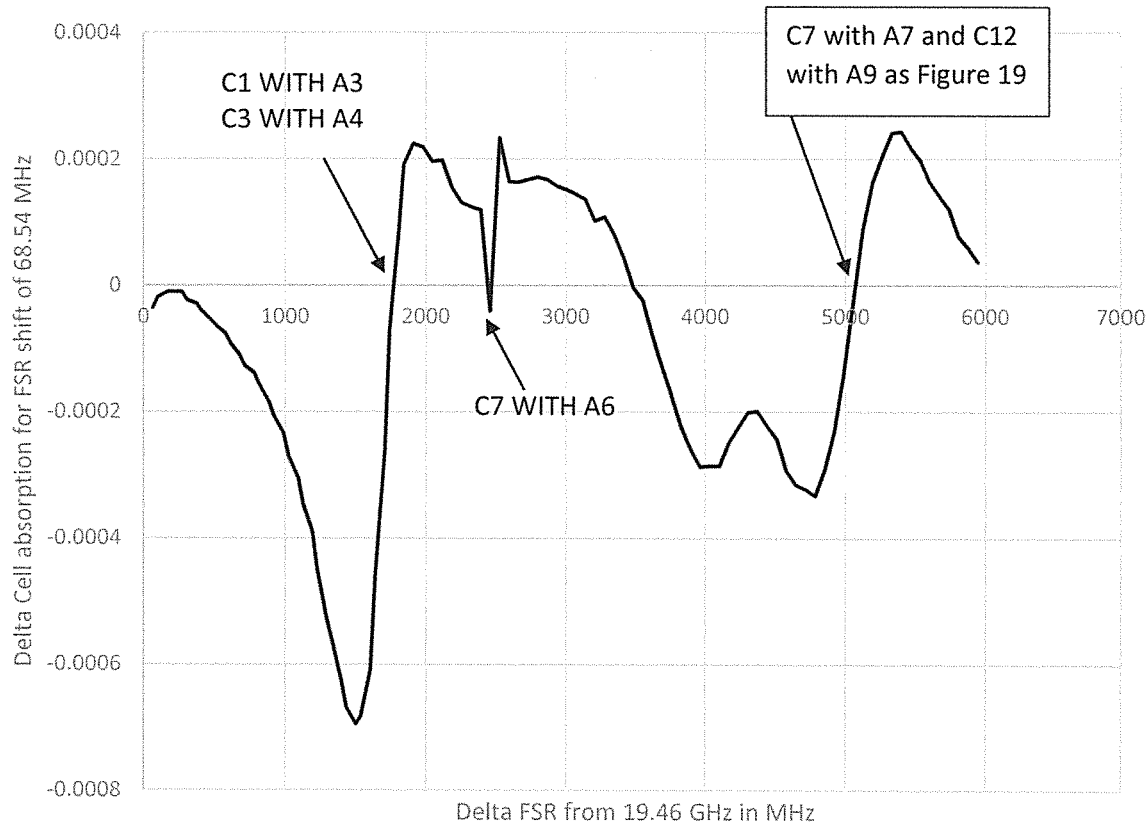

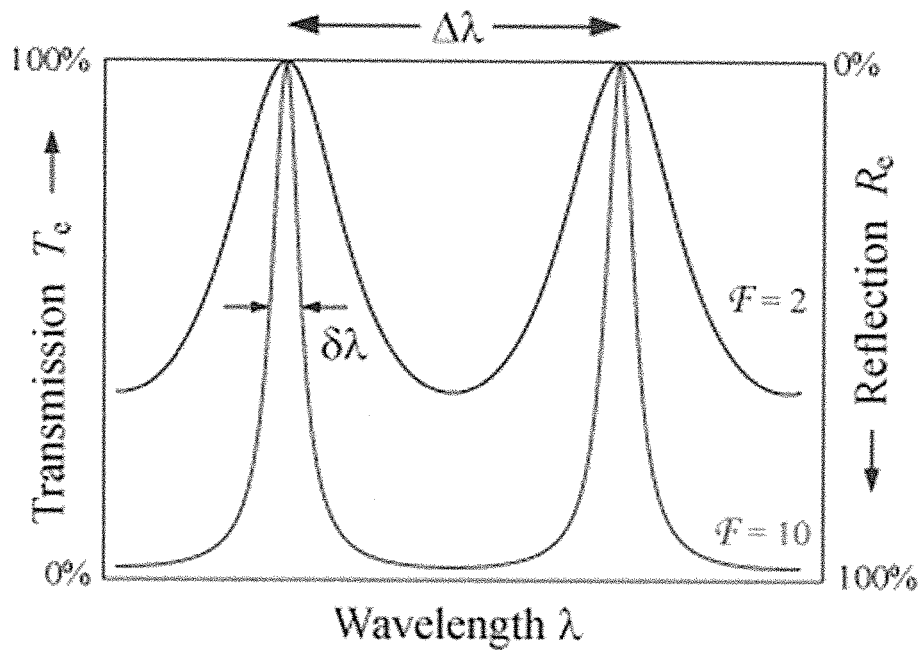
Fig. 14 – Effect of Finesse on Etalon Transmission
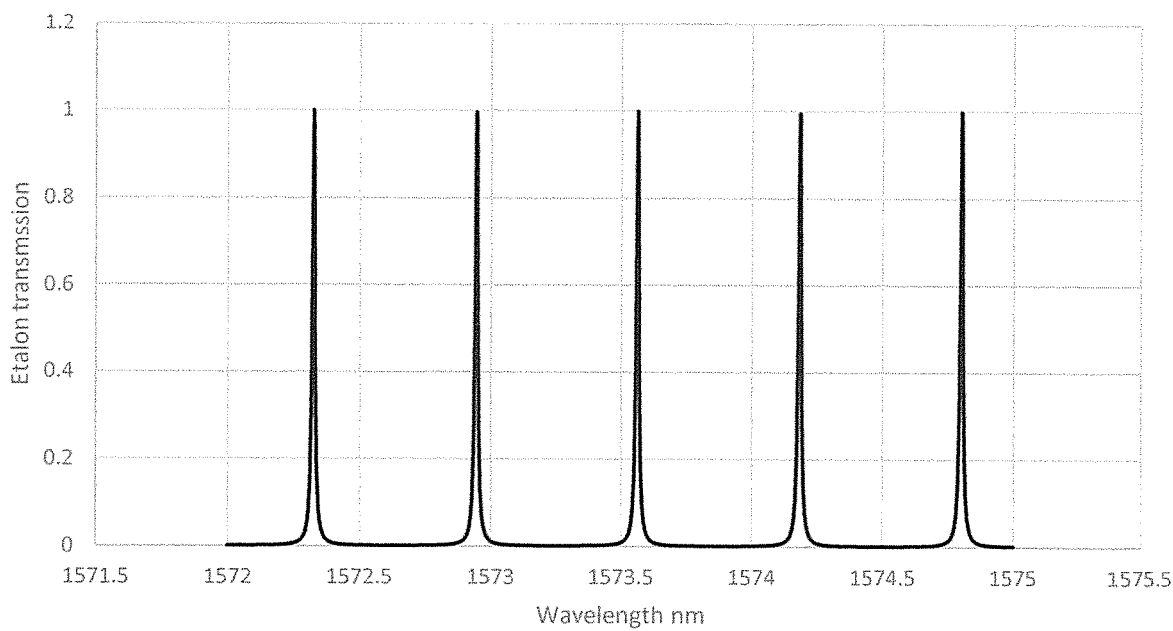

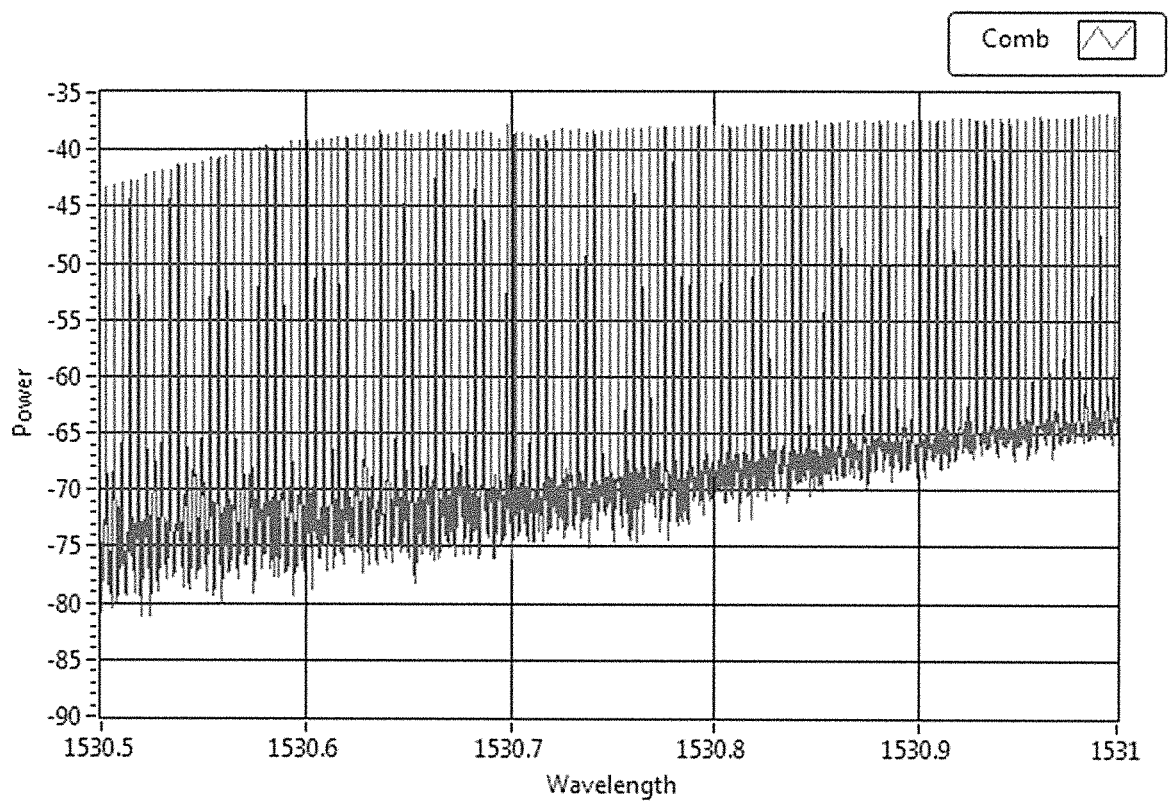
Fig. 17– 500 MHz comb spacing

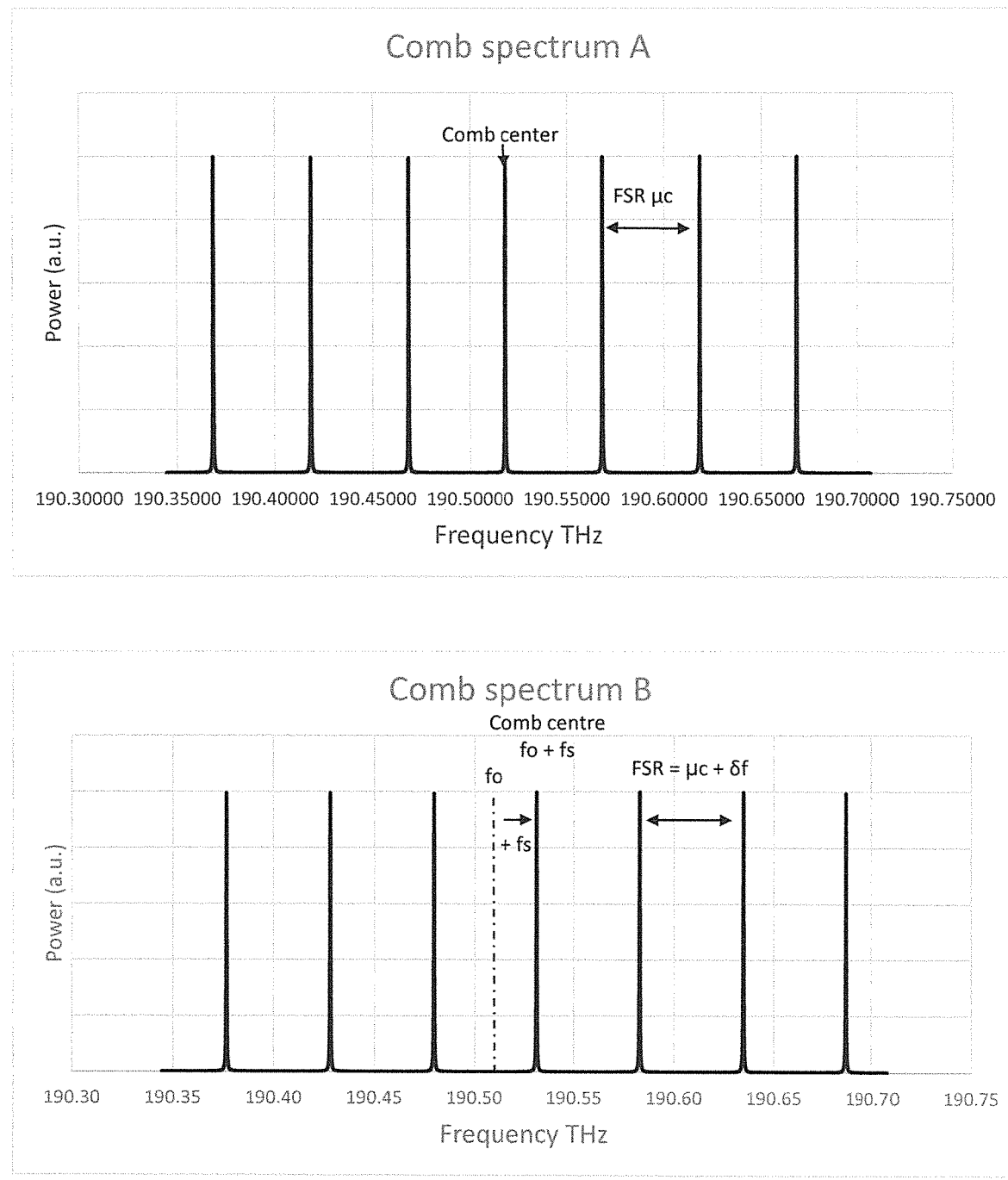
Fig. 18 Dual Comb Spectra

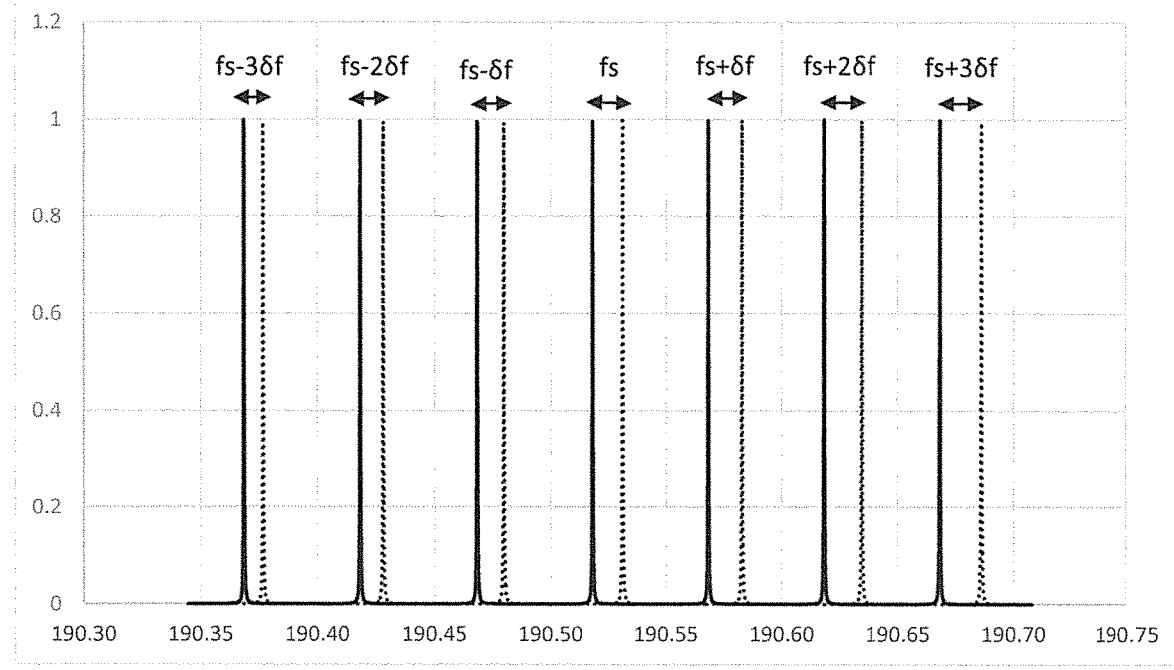
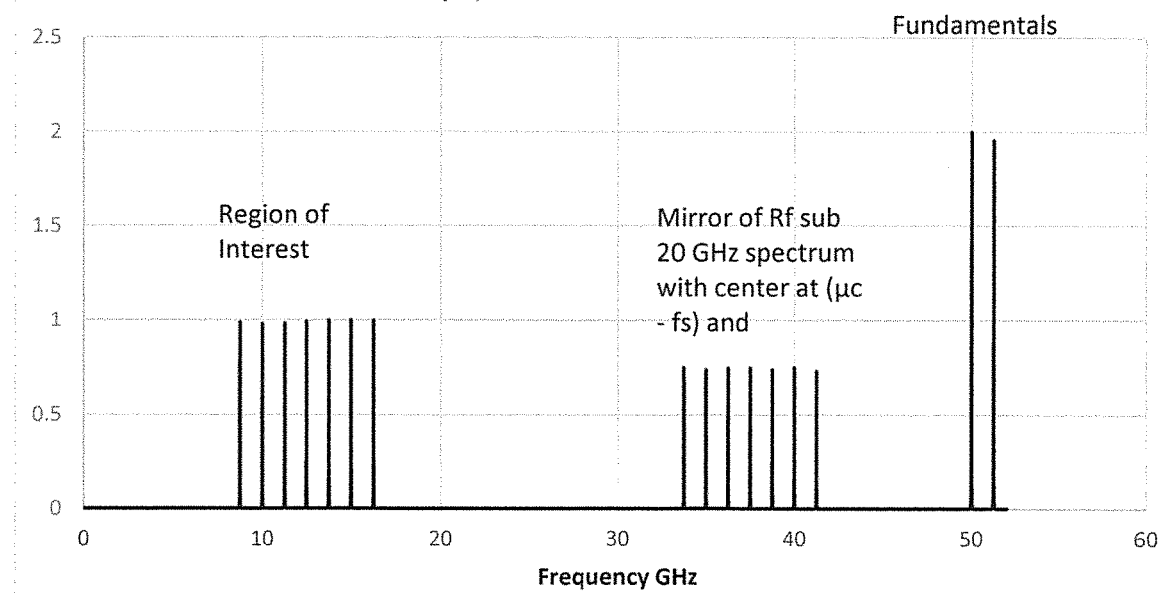
Fig. 19 Dual Comb Spectra

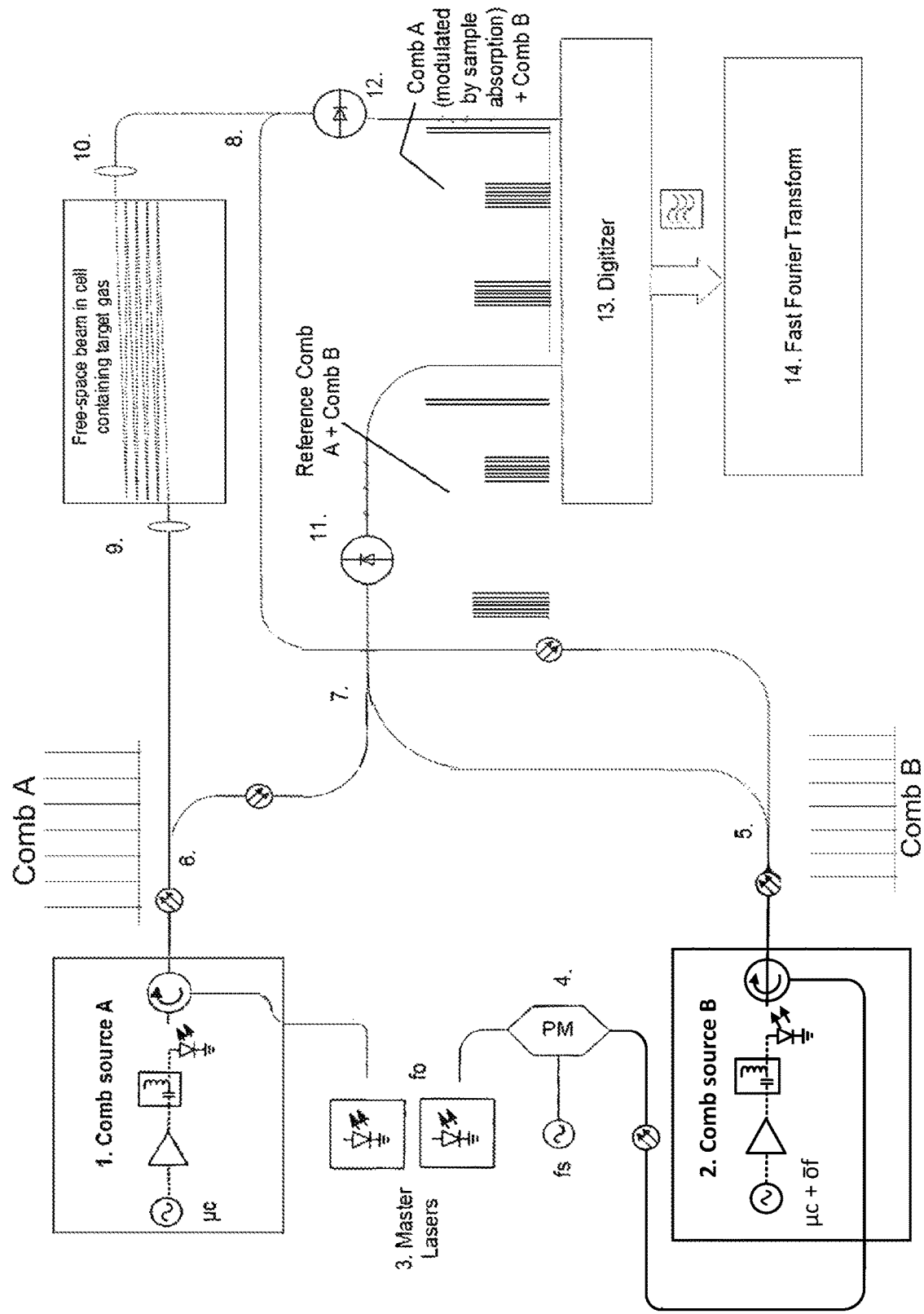

SPECTROSCOPIC DETECTION USING A TUNABLE FREQUENCY COMB

INTRODUCTION

The invention relates to frequency comb generation.

Frequency comb generation by gain switching a laser diode by driving it with a DC bias and RF signal is described in WO2013/037819 and WO2010/106184. The basic arrangement consists of a directly modulated laser, and an RF generator.

Other arrangements are also disclosed in WO2013/037819, one of which consists of a multi-modal semiconductor laser having a Fabry-Perot like lasing cavity; an RF source providing an RF signal for gain switching of the multi-modal semiconductor laser and a tuneable single mode laser that is injected into the multimodal laser. The output from the multi-modal laser is the comb source.

In general fibre coupled laser diodes are supplied in fibre pigtailed packages with a single optical fibre output. In this case it is necessary to inject and get the comb output from the directly modulated laser from the same fibre and a further improvement, described in detail in WO2013/037819, is the addition of a three port optical circulator. A polarization controller may also be placed between the tuneable single mode laser and the directly modulated laser as the injection efficiency into the directly modulated laser is highly polarization sensitive.

A bias T circuit is used to drive the directly modulated laser. The RF can be of variable frequency so that the FSR (free spectral range) of the comb can be adjusted.

The injection laser and the slave laser can be temperature controlled using a thermo-electric cooler in order to stabilise the wavelength of both and prevent drift of the laser and also give a degree of tuning in wavelength of the comb source by altering the controlled temperature. The arrangement is shown in detail in FIG. 1. In this an RF source 1 which has a fixed or variable frequency and can be amplified if necessary by the amplifier 2 and delivered through a Bias Tee circuit 3 to the slave laser diode with a DC bias. The slave laser 3 is injected with the master laser 4 through the circulator 9. The output from the slave, if the correct parameters are used, can be a coherent pulse train which is presented to the output fibre from the circulator 9. The coherent pulse train is an optical frequency comb with the FSR given by the RF source frequency. Thermo-electric (TEC) cooler elements 5 and 7 are used to control the master laser and centre frequency of the comb. It should be appreciated that the master laser need not be a laser diode and could be any low width single mode laser that can be tuneable and has an emission within the gain curve of the slave laser diode. Also the slave laser need not necessarily have a Fabry-Perot cavity and indeed any laser diode that can be directly modulated such as a DFB (Distributed FeedBack laser diode) can be used.

The range of semiconductor laser sources that can be directly modulated is large and covers the UV to the far infra-red. In effect this means that frequency combs can be generated according to the method covering almost the entire range of current spectrophotometry. It should be appreciated that the list below is not exhaustive and is currently expanding as new semiconductor materials are investigated and improvements to current materials including features such as strained quantum wells are made:

Violet blue laser diodes are typically based on gallium nitride or related materials and are available from 390 nm to 490 nm but the range and optical power of these devices are being constantly expanded and LEDs (light emitting diodes) are not now readily available into the UV indicating that robust UV laser diodes may soon be available. Green laser diodes based on gallium nitride are currently available.

Yellow and red laser diodes from 550 nm to 810 nm are available based on the AlInGaP and AlGaAs material systems.

The addition of InGaAs quantum wells and strained quantum has expanded laser diodes based on GaAs substrates to 1.1 μm from 810 nm.

InGaAsP quaternary structures on InP substrates cover a wide range of wavelengths from 1.1 to 1.8 μm.

GaInAsSb cover 1.8-3.5 μm.

Quantum Cascade structures are available from 2.0 to hundreds of microns.

These wavelengths cover all the absorption bands used for trace gas emission.

The spectroscopic methods for gas detection discussed here use the selective spectral absorption features to determine the presence and concentration of a target species. When a gas is present with other gasses a high degree of spectral resolution is required as spectral lines may be close or partially overlap another gas. The use of comb sources where the ultimate resolution is the line-width of the comb lines makes frequency combs suitable sources for trace gas detection.

The spectral absorption coefficient $k_v$ (cm$^{-1}$) is defined as the fraction of incident light at frequency Iv that is absorbed per unit length;

$$k_v \equiv -\frac{1}{I_v}\frac{dI_v}{dx} \quad \text{Equation [1]}$$

This can be integrated to yield the Beer-Lambert relation for a uniformly absorbing medium of length L (cm)

$$T_V = \left(\frac{I}{I_0}\right) = \exp(-k_V L) \quad \text{Equation [2]}$$

With $T_v$ the transmitted intensity fraction and I, the transmitted intensity and $I_0$ the incident spectral intensity. The spectral absorption coefficient $k_v$ in a multi-gas environment of K species comprising of $N_j$ overlapping transitions can be expressed as $$k_v = P\sum_{j=1}^{K} X_j \sum_{i=1}^{N} S_{i,j}(T)\varphi_{v,i,j} \quad \text{Equation [3]}$$

with P total pressure, Xj the mole fraction of species j, Si,j(T) (cm-2/atm) the line strength of the transition i and species j and $\varphi_{v,i,j}$ is the respective lineshape function of transition i. The lineshape function $\varphi_{v,i,j}$ describes the spectral distribution of absorbed intensity relative to the central transition frequency and is defined such that the spectral integral over frequency is unity.

The lineshape function and the line strength of all the main gaseous species are known and widely available in databases and in this way the mole fraction of each species can be determined even in the presence of other gasses provided the spectral resolution of the system can resolve the individual lines and the optical path length is known.

SUMMARY OF THE INVENTION

A long train of coherent pulses will generate a discrete spectrum in the frequency domain that resembles the teeth of comb. The modes of the frequency comb are equidistant and the distance between them equates to the pulse repetition rate. This distance is also referred to as the free spectral range or FSR. Because of the low line width of these sources combined with a stable FSR these combs have a range of applications in spectroscopy, metrology, arbitrary waveform generation and optical signal processing.

If the optical comb source is generated by gain-switching a directly modulated laser diode with light from a single mode laser whilst at the same time driving the directly modulated laser with a DC bias and an RF signal then the comb source hence generated has a number of advantages over other comb sources for molecular spectroscopy. The advantages are; [A] Continuously tuneable FSR and central wavelength over a wide range with no mechanical adjustment required [B] Stable FSR and comb line wavelength [C] Compact and robust comb generation [D] Wide spectral range of laser diodes that can be directly modulated are available from UV to IR allowing comb generation for a wide range of molecular spectroscopy applications [E] Variable quantity of comb lines with a variable power, for example a small number of comb lines with high power per line will suit some requirements. The use of these combs for a variety of spectroscopic applications, and the methods applied, are the invention described.

A number of methods and apparatuses to detect the presence and concentration of molecular species are described which utilise a frequency comb generated by seeding a gain switched laser diode with light from a single mode laser whilst at the same time driving the gain switched laser with a DC bias and RF signal. In this way the centre wavelength of the comb can be selected by setting the wavelength of the single mode laser or by adjusting its temperature or other characteristic and the frequency separation of the comb set by adjusting the RF signal frequency. A wide range of tuneable emission wavelengths are currently available from semiconductor laser diodes ranging from 375 nm GaN devices to tens of microns in the IR with quantum cascade devices The tuneable comb FSR currently available vary from 50 kHz to 30 GHz. This wide range of available wavelengths and FSR can be used for highly sensitive detection of a range of molecular species. The ability to tune the comb spacing means that by interference of two combs an RF beat spectrum can be used to determine absorption spectra of a range of comb lines simultaneously as will be described. Slight shifts in the comb lines caused by vibrational changes in a molecular species can also, as in the prior art of Coherent anti-Stokes Raman scattering, be used to identify the presence and concentration of solid and liquid molecular species. Also an emission spectra that consists of a range of lines can be probed with a comb to obtain a highly accurate and high resolution emission spectrum.

In one embodiment of the invention the frequency comb can be set so that some of the comb lines correspond to absorption peaks of the target gas. Then the centre comb wavelength can be shifted by temperature or other tuning of the master laser and the comb frequency spacing by altering the frequency of the RF source so that some or all of the comb frequencies correspond to the absorbance gaps of the target gas. Hence by comparison of the measurement of transmission of the two combs through the gas, a direct measurement of the presence and concentration of the gas can be determined. In this embodiment the optical path length of the frequency comb applied to the sample gas can be increased to improve sensitivity using a multi-pass cell or a resonant optical cavity.

In another embodiment of the invention two combs can be generated simultaneously with a shift in the centre and comb frequencies in such a way that the difference between the comb frequencies in the first comb and the second comb generate a unique set of difference frequencies $\delta_f$. One comb A is passed through the sample gas and combined with the second comb B. Interference from the two combs will set up a beat RF spectrum corresponding to difference frequencies $\delta_f$. This can be detected by a suitable fast detector and the magnitude of the beat frequency corresponds to the transmission of the comb A through the gas sample. Comb A can be set so that lines or a line corresponds to the absorption peaks of the target gas and in this way an absorption spectrum can be determined and the concentration of the gas determined. A multi-pass cell can also be used in this embodiment to improve sensitivity.

In another embodiment of the invention, the sample cell is a high finesse etalon, also referred to as a resonant cavity and one or some of the comb frequencies obtained by the method can be tuned to correspond to these frequencies. In this way a detailed absorption spectrum of the gas can be obtained by using the high finesse cavity to select the absorption peaks and troughs of the target gas that will modify the transmission of a comb source. This comb source can be probed using a number of techniques discussed, including another comb as in the previous embodiment. In another embodiment of the invention a single comb, as described, which in effect is a train of pulses in the time domain, can be split in two and the time gap between the pulses varied. In this case the first laser pulse causes chemical bonds in the molecule to vibrate and causes a change in the refractive index of the sample to vary periodically. The energy from this vibration causes a shift in the wavelength of the second pulse that can be probed as a function of delay of the second pulse train. As each type of molecule has a distinct signature of vibration frequencies by looking at the beat spectrum the presence and concentration of different molecules can be determined. In this case the method can be used on semi-transparent and solid samples for example microscopy where it can be used to identify a particular species.

In another embodiment of the invention a single tuneable comb source as described can be used to probe the emission spectrum of an astronomical observation of emission lines, or absorption gaps, or a plasma source and accurately determine red-shifts or other measurements as required.

According to the invention, there is provided a method of performing spectroscopic measurements, the method comprising the steps of providing an optical frequency comb, and directing the comb through or at a sample.

In one embodiment, the optical frequency comb is generated by gain switching a laser diode. In one embodiment, the gain switched laser diode is constructed from Gallium Nitride and related materials.

In one embodiment, the spectroscopic detection is in the blue, green and ultra-violet region of the electromagnetic spectrum. In one embodiment, the gain switched laser diode is constructed from Gallium Arsenide (GaAs), or Aluminium Gallium Arsenide (AlGaAs), or Aluminium Indium Gallium Phosphide (AlInGaP), or Indium Phosphide (InP), or Gallium Indium Arsenide Phosphide GaInAsP or a combination of these materials, and the spectroscopic detection is in the green, yellow, red and near infra-red region of the electromagnetic spectrum.

In one embodiment, the gain switched laser diode, is constructed with quantum wells made from InGaAs, strained or otherwise in the active region, and the spectroscopic detection is in near infra-red and infra-red region of the electromagnetic spectrum.

In one embodiment, the gain switched laser diode is constructed with Gallium Indium Arsenide Antimonide (GaInAsSb) or related materials, and the spectroscopic detection is in infra-red region of the electromagnetic spectrum.

In one embodiment, the gain switched laser diode is constructed as a quantum cascade laser, and the spectroscopic detection is in infra-red and far infra-region of the electromagnetic spectrum.

In one embodiment, the apparatus carries out direct absorption spectral measurements that are dispersed by a diffractive element such as a grating.

In one embodiment, the comb lines are passed through a sample and are then spatially fanned out in wavelength or frequency before being monitored by a CCD array or separated by a device such as an optical spectrum analyser or Fourier transform spectrometer.

In one embodiment, the optical frequency comb is used with a multi-pass cell that contains a gaseous sample of known molecular absorption spectrum and the comb is used to interrogate the molecular absorption lines and by using the dispersive diffractive element to determine the concentration and/or pressure of a gaseous species.

In one embodiment, the emission comb is set to approximately the same as the absorption comb or a multiple of the absorption comb so that the emission comb is in gaps between the absorption bands, and the incident comb will experience little or no absorption. In one embodiment, the incident comb is moved to a position where a number of the comb lines are interacting with the absorption bands and the comb experiences a large absorption when passing through the sample.

In one embodiment, the centre wavelength of the incident comb is moved so that some or all of comb lines will interact with the gaps between the absorption bands, and/or to move the centre wavelength absorption position so that some or all of the comb lines are absorbed by the molecule whereby a comparison of the transmissions can then be made to determine the concentration and presence of a molecular species. In one embodiment, the frequency comb is set up so that there is a strong resonance that can be detected.

In one embodiment, the centre frequency of an optical frequency comb is adjusted to known position such as an absorption band or gap and the comb source is then adjusted so that one or more comb lines interact with molecular absorption bands of the molecule and the distance to those absorption peaks can be accurately determined by monitoring change in transmission, and the apparatus can be used to determine the presence of a molecule and its relative concentration.

In one embodiment, the optical frequency comb is used to modify the FSR to match, or a whole multiple thereof to match, the frequency separation of two or more molecular absorption bands at the centre wavelength of the comb, and/or to modify the FSR so that some or all of the comb lines interact with the absorption bands of the molecule, whereby a comparison of the transmissions can then be made to determine the concentration and presence of a molecular species.

In one embodiment, the method comprises the steps of using the filter characteristic of a resonant cavity to increase the resolution of a spectrophotometer by using a comb source with an FSR a fixed multiple (N) of the FSR of the resonant cavity and then using the resonant cavity to selectively pick off every N comb lines and present this to a spectrometer, moving to N+1 in the resonant cavity and then presenting sequentially to a spectrometer, then N+2 and so on until an entire spectrum is built up.

In one embodiment, the optical frequency comb uses a resonant cavity containing a gaseous species and matching of the FSR of the comb is performed to whole multiple or whole fraction of the resonant cavity FSR, a central frequency of the comb is scanned to match the central frequency of the resonant cavity and the detection of the intensity of the comb lines with a dispersive element such as an FTIR spectrometer. In one embodiment, the optical frequency comb uses a resonant cavity that may or may not contain a gaseous species and uses a resonant cavity to transmit one in every N comb lines, where N is a whole number, to read the intensity of each of the transmitted comb lines using a dispersive element.

In one embodiment, the method comprises the step of causing the centre wavelength of the resonant cavity to move by means of for example a piezo-electric transducer or other means to another set of adjoining comb lines.

In one embodiment, a time resolved transmission or reflection spectrum is resolved and the ultimate resolution of a spectrophotometer is improved by a factor of N limited by the resolution of the comb line. In one embodiment, the optical frequency uses a high finesse optical cavity that acts as a storage device for optical radiation, and monitoring of the decay of those comb lines is performed after the source is switched off to determine the optical absorption within the cavity.

In one embodiment, the apparatus uses two optical frequency combs and mixes these combs on a detector to create a RF beat frequency and the interrogation of the RF spectrum to determine the absorption or transmission of comb lines.

In one embodiment, the apparatus uses the optical frequency comb for coherent anti-Stokes Raman spectroscopy.

In one embodiment, the apparatus uses the optical frequency comb to probe emitted spectral lines from a Plasma or other source by using an RF beat frequency.

In one embodiment, the apparatus uses the optical frequency comb to probe emitted spectral lines from an astronomical source to examine red-shifts.

In another aspect, the invention provides an apparatus for performing spectroscopic measurements, the apparatus comprising an optical frequency comb source, means for directing the comb through or at a sample, a detector for monitoring radiation from the sample, and a controller for performing a method as defined above in any embodiment.

In one embodiment, the comb source is adapted to generate the optical frequency comb by gain switching a laser diode In one embodiment, the gain switched laser diode is constructed from Gallium Nitride and related materials.

In one embodiment, the gain switched laser diode is constructed from Gallium Arsenide (GaAs), or Aluminium Gallium Arsenide (AlGaAs), or Aluminium Indium Gallium Phosphide (AlInGaP), or Indium Phosphide (InP), or Gallium Indium Arsenide Phosphide GaInAsP or a combination of these materials, and the spectroscopic detection is in the green, yellow, red and near infra-red region of the electromagnetic spectrum.

In one embodiment, the gain switched laser diode, is constructed with quantum wells made from InGaAs, strained or otherwise in the active region, and the spectroscopic detection is in near infra-red and infra-red region of the electromagnetic spectrum. In one embodiment, the gain switched laser diode is constructed with Gallium Indium Arsenide Antimonide (GaInAsSb) or related materials, and the spectroscopic detection is in infra-red region of the electromagnetic spectrum.

In one embodiment, the gain switched laser diode is constructed as a quantum cascade laser, and the spectroscopic detection is in infra-red and far infra-region of the electromagnetic spectrum. In one embodiment, the apparatus comprises a diffractive element such as a grating for direct absorption spectral measurements that are dispersed by the diffractive element.

In one embodiment, the apparatus comprises means for spatially fanning out in wavelength or frequency a comb before being monitored by the detector.

In one embodiment, the optical frequency comb source comprises a resonant cavity containing a gaseous species and means for matching of the FSR of the comb to a whole multiple or whole fraction of the resonant cavity FSR, means for scanning a central frequency of the comb to match the central frequency of the resonant cavity and the detection of the intensity of the comb lines with a dispersive element such as an FTIR spectrometer.

In one embodiment, the apparatus comprises a means such as a piezo-electric element to causing the centre wavelength of a resonant cavity to move to another set of adjoining comb lines.

In one embodiment, the apparatus comprises a high finesse optical cavity that acts a storage device for optical radiation, and means for monitoring of the decay of those comb lines after the source is switched off to determine the optical absorption within the cavity.

In one embodiment, the apparatus comprises at least two optical frequency combs and means for mixing the combs on a detector to create a RF beat frequency and the interrogation of the RF spectrum to determine the absorption or transmission of comb lines.

In one embodiment, the controller uses the optical frequency comb for coherent anti-Stokes Raman spectroscopy.

In one embodiment, the controller uses the optical frequency comb to probe emitted spectral lines from a plasma device or other source by using an RF beat frequency.

In one embodiment, the controller the optical frequency comb to probe emitted spectral lines from an astronomical source to examine red-shifts.

DETAILED DESCRIPTION OF THE INVENTION

The invention will be more clearly understood from the following description of some embodiments thereof, given by way of example only with reference to the accompanying drawings in which:

FIG. 3 is a plot of an absorption spectrum of $CO_2$ around 1572 nm;

FIG. 4 is a plot of $CO_2$ absorption with the laser frequency comb in the minimum absorption position;

FIG. 5 is a plot showing $CO_2$ absorption with laser frequency comb in the maximum absorption position;

FIG. 6 is a diagram illustrating an alternative apparatus, having a comb source, a photodetector, and a lock-in amplifier;

FIG. 7 shows a further apparatus of the invention, having a modulator after the comb source and a gas cell multipass component before the photodetector;

FIGS. 8 to 15 are plots illustrating aspects of operation of the apparatus of the invention, as described in the captions of the plots;

FIG. 17 is a plot showing 500 MHz comb spacing, and FIGS. 18 to 19 are various spectra; and FIG. 20 is a diagram illustrating a further apparatus in which there is a free space beam and a digitizer.

In one embodiment (A) of the invention a frequency comb is used for high to medium sensitivity gas detection by direct spectral absorption. The absorption spectrum of the gaseous species can be determined by moving the centre wavelength of the comb and the comb spacing (FSR) in order to resolve as much detail as required.

Figure 1:
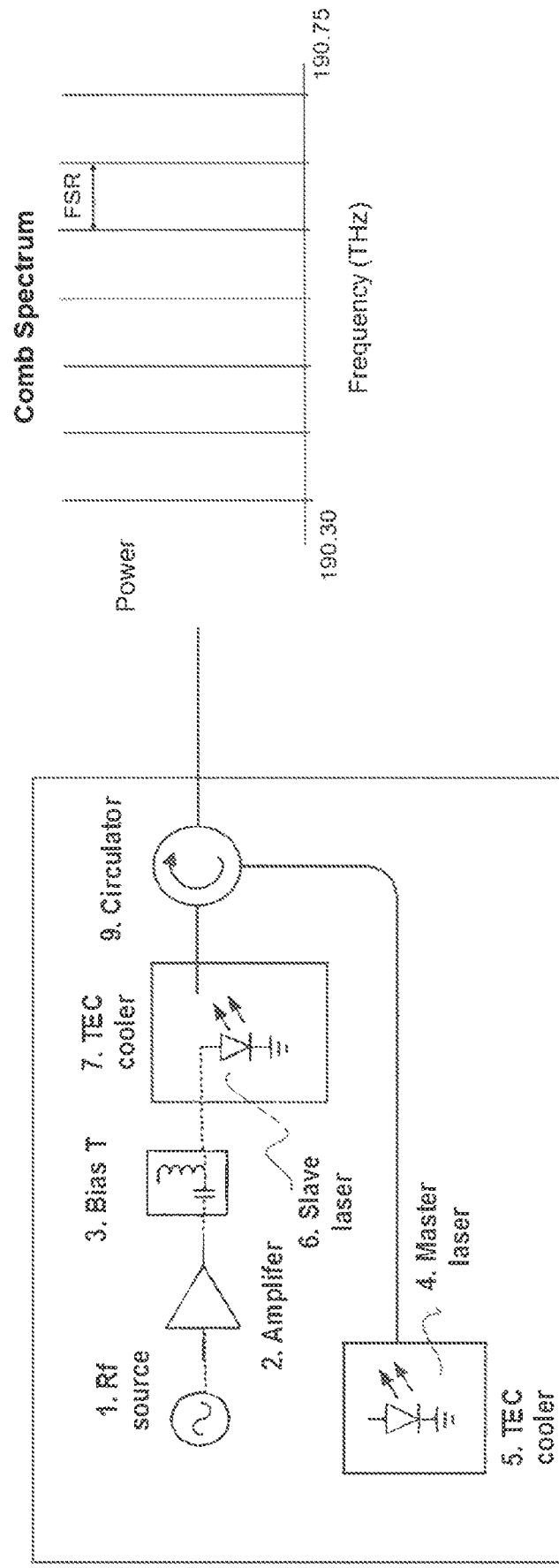
FIG. 1 is a diagram illustrating gain switched laser diode comb generation of the prior art as described above.
Figure 2:
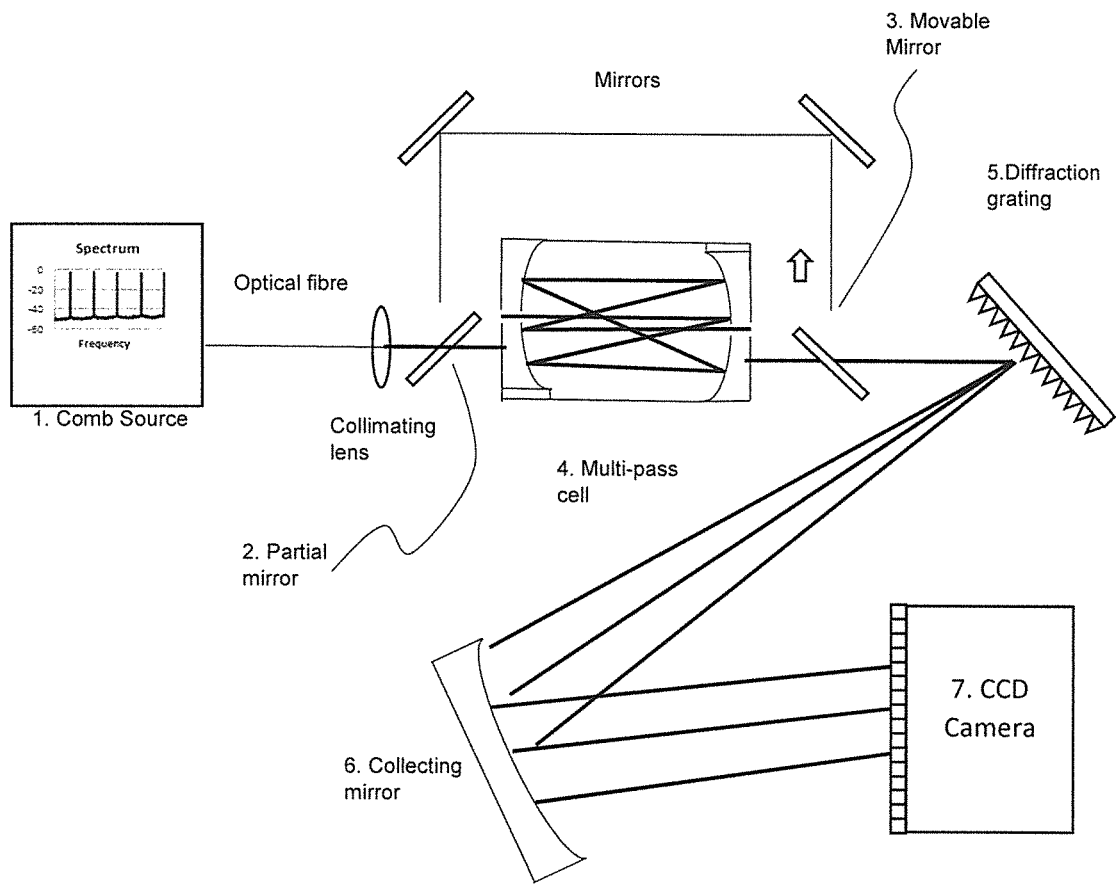
FIG. 2 is a diagram illustrating an apparatus of one embodiment, in which spectral absorption is measured by a multi-pass sample cell and a dispersive element.

A schematic of this embodiment is shown in FIG. 2. Comb lines generated by a gain switched laser diode are presented to a sample. These comb lines are passed through a gas and are then fanned out in wavelength or frequency and monitored by a CCD or a detector or a moving slit or a moving grating. In more detail, a frequency comb 2.1 is generated using a gain switched slave laser diode, and the centre frequency of the comb is chosen to be close to 1.57 μm and the comb spacing set fixed or variable. This is delivered by an optical fibre which can be collimated to create a free space beam. A portion of this beam is reflected as a reference and spectral measurement of the reference can be achieved by moving in and out a movable minor 2.3. The separate comb lines are fanned out using a dispersive element such as a diffraction grating 2.5 so that all the comb lines are spatially separated and their intensity monitored by a detector 2.7 such as a CCD InGaAs camera.

It should be appreciated that to resolve closely spaced comb lines a person skilled in the art of spectroscopy can resolve these lines using various techniques such as increasing the optical length of the spectrometer, the resolution of the CCD and other techniques. Furthermore apparatus such as virtually-imaged phased array (VIPA) dispersion spectrometer can be used to separate and monitor the comb lines. A Fourier Transform Infra-red (FTIR) spectrometer could also be used. Referring to FIG. 6, in another embodiment (B) of the invention the frequency comb is used for high to medium sensitivity gas detection of $CO_2$ also by direct spectral absorption. This detection of $CO_2$ is for example only and other gasses can be detected in a similar fashion, in the presence of other gasses, using this method. The comb centre wavelength and FSR can be adjusted as described to correspond to a molecular absorption line or lines. The instrument can then be used to examine other gases by moving the centre wavelength of the comb and/or the FSR within the range of the instrument.

In this embodiment the distinct molecular signature of a molecular species is used to improve the sensitivity of the gas detection and by adjusting the free spectral range or FSR of the optical comb as discussed.

The $CO_2$ absorption spectra in the 1.4 μm to 1.65 μm region are characterised by a Fermi Tetrad. One of these transitions from the ground state (00° 0) to the upper state (30°1, 06°1)II has a set of absorption lines near 1.57 μm at room temperature as shown in FIG. 3.

Referring to FIGS. 3 to 5, many molecules have a fine absorption spectrum which looks like a comb such as shown in FIG. 3 for $CO_2$. If the emission comb is set to approximately the same as the absorption comb (or a multiple of the absorption comb) then the emission comb is in the gaps between the absorption bands as shown in FIG. 4, in which case a comb will experience little or no absorption and then can be moved to a position as shown in FIG. 5 where a number of the comb lines are interacting with the absorption bands and the comb experiences a large absorption when passing through the gas.

In more detail, these absorption lines correspond to a comb-like absorption spectrum. Around the largest absorption line at 1572.34 nm the absorption lines are about 320 pm apart or approximately 39.86 GHz. A frequency comb can be generated by the method discussed with the centre wavelength (as defined by the comb frequency with the maximum power) at 1572.419 nm or quarter of the distance to the absorption line on the right. Furthermore the spectral comb line separation or FSR can be set to 19.486 GHz or half the absorption comb separation. In this case the absorption of the gas as the comb passes through is at a minimum as shown in FIG. 4. Subsequently the centre emission comb can be moved to 1572.493, by temperature tuning the master laser, replacing the master laser with an ECL and tuning its centre wavelength, or by changing the drive current in the master laser. The FSR is fixed in this method. In FIG. 5 we can see in this case four of the comb lines that are resonating with $CO_2$ absorption lines. Hence there will be a reduction in the transmission through the cell that can be detected with a photodiode. In U.S. Pat. No. 5,886,247 a method is discussed for the high sensitivity gas detection that uses a broadband source and comb filter with an adjustable FSR and centre wavelength. This invention has a number of significant advantages, by using a laser comb source and not a filter. Firstly a laser comb source will have significantly more power per comb line than a filtered white light source, secondly as it is a laser source it can be efficiently delivered using low loss single mode fibre to the site of interest, thirdly the FSR can be tuned to the molecular absorption by altering the RF frequency and centre wavelength which can be changed rapidly and efficiently with no moving parts. Also the linewidth of the comb lines can be made to as little as 200 kHz, significantly better than a comb filter improving sensitivity. 58862647 is significant prior art however as it shows how a comb can be used in resonance with a molecular species but uses a completely different technique.

Referring again to FIG. 6, the apparatus comprises a tuneable wavelength and FSR comb source. The FSR is altered by changing the frequency of the RF source 6.1. The output wavelength from of the master laser 6.3 is chirped in this case by altering the temperature by approximately 2°. This is achieved by altering the current through the thermoelectric cooler 6.4. In order to maintain injection locking it may be required to move the slave laser temperature 6.2 simultaneously. In this case the lock-in amplifier will give an output reading that corresponds to the concentration of the target molecular species in the Multi-pass gas cell. The use of a lock-in amplifier will increase the sensitivity by reducing the effects of background light source drift and white and shot noise in photodetector. In this case the chirp frequency of the master laser 6.3 can be used as this corresponds to the movement of the comb and in this case a good correlation can be obtained between the output from the lock-in amplifier and concentration of $CO_2$ in the Multi-pass cell. The temperature chirping of the master can be achieved by briefly interrupting the TEC cooler current which will cause a short term rise in the master temperature. Alternatives for temperature chirping that would also be applicable would be to use an ECL (External cavity laser) as the master source and slew through the wavelength range, or to alter the drive current through a multi section laser diode so as to alter its peak output emission wavelength. The advantages of this method are that a single concentration can be determined at a given gas pressure. In some applications however like waste gas absorption the pressure and concentration are both varying and the line width of the spectral absorption lines will increase. When temperature tuning is used it may not be possible to reach a good frequency response of several kHz in order to reduce shot noise in the detector.

An absorption spectrum of a gas consists of a number of strong lines and the distance between these lines is fixed. If a frequency comb is set up so that it is the same as this distance, or a multiple of, then there is a strong resonance that can be detected using various techniques. Say for example the separation of two strong absorption lines of ammonia is 28.000 GHz at 1300 nm. If FSR of the comb is set to 28.000 GHz or 14.000 GHz then there is a very strong effect on scanning through 1300 nm with the comb. If the system varies the FSR and repeats the scan it will see a peak absorption at 28.000 GHz or 14.000 GHz, positively identifying that is ammonia as no other gas will have a separation of exactly 28.000 GHz. In effect this is looking at the signature of a particular molecule and it can distinguish a molecule in a background of other absorption bands and is very powerful. In this way the optical comb source is used as an optical ruler in the frequency or wavelength domain and the FSR is used like variable notches on a ruler that are moved until they interact with an absorption band and the distance between those absorption bands are unique to the molecule.

In order to take measurements at a range of centre comb frequencies and also look at the line width of the absorption lines an additional modulator can be used. Also a reference signal can be extracted from the comb so drifts in the comb optical power during measurement to eliminate this as a cause of instability.

A diagram of the apparatus is shown in FIG. 7. An optical comb source 7.1 is linked to modulator or optical chopper 7.2. The frequency of the modulator is set to approximately 10 kHz so that shot noise in the two photodetectors are minimized and any short term drifts in background are eliminated. The output from a modulator is then passed through an optical splitter with, for example, 90% of the output going to gas cell and 10 percent and the reference comb going directly to photodiode 7.8. The output of photodiode 7.8 can be amplified by an amplifier 7.9 to reach an equivalence with the output from photodiode 7.7 when there is no absorption in the gas cell, for example when it is evacuated. When absorption occurs by the introduction of a molecular gaseous species then this difference will be amplified by the difference amplifier 7.10 and presented to the lock-in amplifier 7.12 which will detect very small changes in the relative signals between photodiode 7.8 and 7.7. This signal difference will be proportional to the relative concentration, path length in multi-pass cell and pressure of the gas and also free from low frequency shot noise in the photodetectors and drifts caused by background light and movements in comb power as the comb centre wavelength is moved and the FSR is moved.

With this apparatus a method can be used that takes advantage of the controlled FSR of the comb source and the narrow line width of the comb lines to interrogate the spectral absorption lines to a very high resolution and sensitivity. At 1.50 µm the spectral resolution of a dispersive spectrometer is limited practically to about 5 GHz and a very long path length folded type and bulky configuration with an InGaAs CCD array would be required. An FTIR spectrometer is limited to about 1 GHz as the moving parts and other components used can only be produced to a given accuracy. The invention as described has no moving parts and the resolution is limited fundamentally by the jitter in the RF signal and the resolution of the comb line which can be as good 300 kHz. It is an optical ruler that can be run over the spectral region of interest. Overall we can see an improvement of up to three orders of magnitude over conventional spectrophotometry.

Some ECLs (External Cavity Lasers) have line widths of this level and an ECL can be used to scan an individual absorption line or lines. There is a significant quantity of prior art on using ECLs for high sensitivity gas detection. However the invention has two advantages over an ECL in that it is getting information on a number of absorption lines simultaneously which increases the speed of the acquisition, has no moving parts and can be FSR tuned to molecular vibrational modes of the species of interest in order to distinguish and compensate for other competing absorption lines in the region of interest. The fact that the FSR can be accurately tuned means that the position of the central frequency of comb can be accurately determined when the comb is passed through gas containing a known species to a high degree of accuracy approaching 1 MHz at 1.5 µm. This ability to self-calibrate the central wavelength is another significant advantage over ECL spectroscopy.

For example in order to examine the concentration of $CO_2$ in a gas cell the initial FSR can be set to 19.486 GHz and the central comb frequency can be set to approximately 1571 nm by changing the temperature, or other characteristic, of the master laser or both the master and slave laser. The central comb can be then moved through the lines to approximately 1573 nm. The output from the lock-in amplifier will show an absorption peak with the shape as shown in FIG. 8. The maximum will occur when the comb is in resonance as shown in FIG. 5 and the minimum as in FIG. 4. In this way the comb can find the absorption peak and trough and there is no need to know the starting comb wavelength to a high degree of accuracy a priori. This is a major advantage as the detection system can be made, to some degree at least, self-calibrating in wavelength to a high degree of accuracy.

Once the comb has been centred the comb can then be moved by an equivalent of one comb FSR and back again over a number of seconds or the time it takes for the lasers to stabilise at each wavelength. In the example this is achieved by ramping and cooling the master wavelength by 1.7° C. As shown the output from the lock-in amplifier will then follow a characteristic curve as shown in FIG. 9. The peak to trough ratio is directly proportional to the concentration of $CO_2$ in the multi-pass cell and the path length of the beam in the cell. The sharpness of the peak will be a function of the gas pressure as these bands will widen as the pressure fluctuates. In this way we can get pressure and concentration of $CO_2$ simultaneously. Furthermore, if other absorption bands from other species overlap they should not have harmonics at 39.86 GHz and will appear as distortions in monotonic increase followed by a decrease as the comb centre is shifted by half the absorption FSR allowing a de-convolution by curve fitting to remove the overlapping absorption band from the calculation.

Another method is to lock the centre wavelength and increase the FSR. This will cause the comb to gradually fan out and as comb lines interact with absorption lines cause a rapid increase followed by a rapid decrease in absorption as the comb lines move through the lines.

For $CO_2$ this method is demonstrated at 1.574 nm. The comb is set to the minimum absorption position as in the previous method and this is shown in FIG. 10. The FSR is set 19.46 GHz so that most of the comb lines are in the minimum absorption position and not interacting with the absorption peaks. Gradually the comb FSR is increased to 24.46 GHz and the output signal from the Lock-in amplifier measured. Gradual rises and falls in signal will be seen and these will be interspersed with large changes upwards and downwards as comb lines move through the absorption lines. This will give rise to a unique molecular signature and allow the position of the molecular lines to be determined with a high degree of accuracy as shown.

The comb lines and the absorption lines are marked for the sake of clarity in FIG. 10 from the right hand side inwards in increments of one. In this way the first comb line on the right (longest wavelength) is marked as C1, the next line on the left (shorter wavelength) is marked as C2 and so forth. A similar marking is used for the gas absorption lines as shown in FIG. 10. The centre wavelength of the comb is fixed and the FSR initially set to 19.46 GHz. The FSR is then gradually ramped to 25.46 GHz and the output from the lock-in amplifier monitored. This has the effect of gradually fanning out the comb lines from the centre as shown by the arrows indicated. These comb lines will interact with the gas absorption bands and cause a change in the signal from the lock-in amplifier.

For example, in FIG. 11 the case where C9 overlaps with A7 and C12 overlaps with A9 there is a significant increase in cell absorption. This overlap occurs at 5.595 GHz FSR increase.

The change in cell absorption with FSR increase is shown in FIG. 12. By taking the differential of the cell absorption, the position of the peaks can be accurately determined as the differential moves from negative through zero. The differential is shown in FIG. 13 and as the FSR is shifted from 19.46 to 25.46 GHz three distinct peaks can be observed and their location determined to an accuracy of 1 MHz or better. This differential is a unique signature of the vibrational states of the molecule and can be used to determine the pressure and concentration of the gas when the optical path length of the laser beam in the gas is known.

Resonant Cavity

Figure 16:
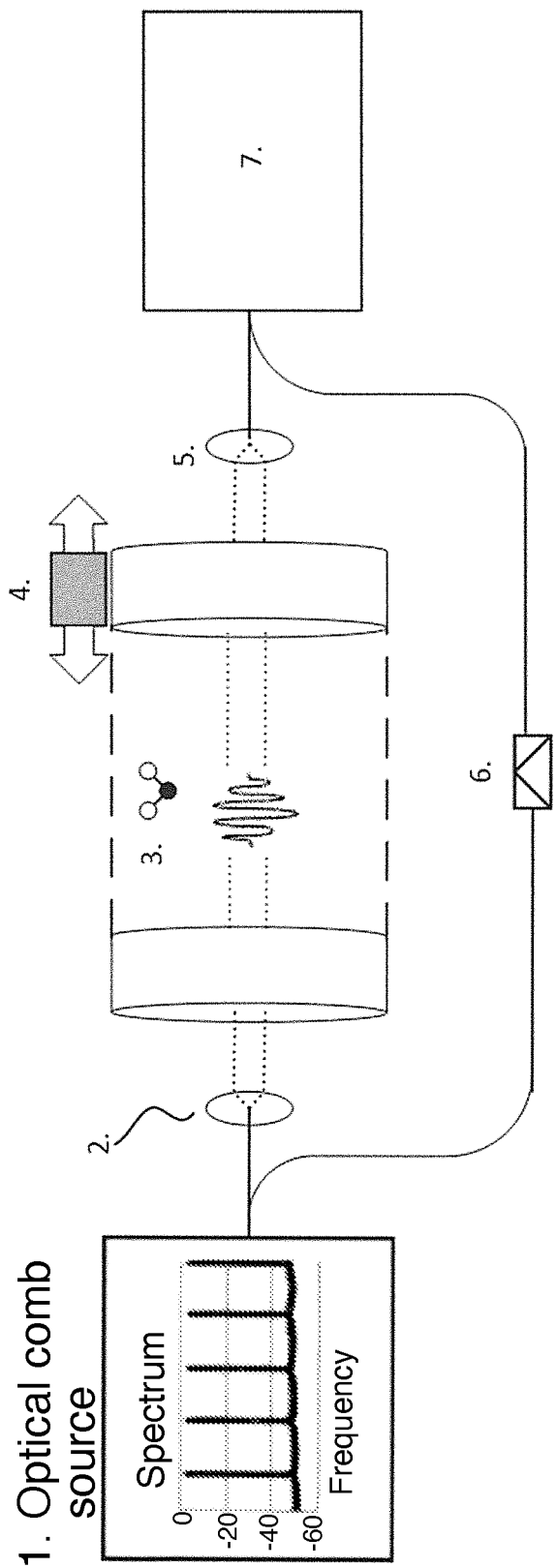
FIG. 16 is a diagram illustrating an apparatus having a resonant cavity with a comb source.

A resonant cavity is a Fabry Perot Etalon formed by two highly reflective mirrors as shown in FIG. 16. If the region in between the mirrors is filled with the gas to be analysed then the cavity can be used to increase the interaction time of a comb pulse as it is partially absorbed by the a gaseous molecule.

If high reflectivity mirrors are used a large portion of the comb beam is reflected on each interaction with the cavity mirrors. In effect this will cause individual photons in the comb pulse to have a high probability, given by the reflectivity R of the mirror to be returned and circulated within the cavity increasing its interaction length with any molecular absorption within the cavity. The effective path length is given by $l/(1-R)$ where l is the length of the cavity and R is the reflectivity of the cavity mirrors. This can be used when there is a low concentration of the gas as the effective path length of the laser beam can be increased to hundreds of meters or kilometres and increasing the gaseous absorption by the significant factor. The use of multilayer dielectric coatings can boost the reflectivity of the mirrors to 99.99% or greater increasing the effective path length to the kilometer range for a one metre cavity.

Another advantage of a resonant cavity is that it consists of regularly spaced transmission lines as shown in FIG. 15. The transmission lines can be tuned to the emission comb lines hence ensuring that all comb lines are transmitted into the cavity and the effective path length of each line is improved as discussed above. Also, light outside the comb lines such as stray background light is not transmitted by the cavity, reducing noise and improving sensitivity. Depending on the cavity design and the comb source the cavity can be tuned to a harmonic of the cavity or vice-versa to achieve the desired effect. For example if the cavity spacing is 1G (Where G is defined as the cavity FSR in the frequency domain) then the comb spacing can be set to 2G or nG where n is a whole number. Similarly if the comb spacing is 1C ten the cavity spacing can be set to nC.

There is prior art disclosing the use of resonant cavities for high sensitivity gas detection. As an example, US2008/0074660 discusses the use of high finesse cavities for gas detection. The finesse of a cavity is a measure of the sharpness of the transmission peaks as shown in FIG. 14. When, as in the prior art, the etalon is used as a wavelength selectable filter, the finesse of the cavity is a very important parameter. In reality because of mirror tilt and surface roughness of the mirrors the finesse of the resonant cavity is limited and requires very high tolerance components and is not limited by mirror reflectivity. Also the mirrors suffer from dispersion which limits the number of comb lines that can be coupled into the cavity as the FSR of the cavity will change with frequency or central wavelength hence reducing the number of lines of resonance with the emission comb which has a fixed FSR, to a high degree of accuracy, in frequency.

Prior art discusses the use of passive mode locked lasers with a resonant cavity. There are a number of issues with the use of mode-locked lasers that are addressed by the invention.

Where the resonant cavity is used as a tuneable filter to enhance the spectral resolution then a very high finesse cavity is needed. The high mechanical tolerances required for high finesse can cause issues in extreme environments with temperature and mechanical stresses such as remote gas concentration detection or effluent gas concentrations in turbines. The invention only uses the reflectivity of the mirrors in order to enhance the interaction length in the gas and is much more tolerant to surface roughness and tilt. The effective spectral resolution of the invention is limited by the line-width of the comb lines which can be as good as 200 kHz and the line width of the resonant cavity which is a function of the Finesse is not important. The gain in sensitivity is entirely due to the enhancement in interaction length that is a direct function of the mirror reflectivity.

Another feature of mode locked lasers is that they have a large number of comb lines and span a large wavelength range. The dispersion of the cavity mirrors, which are generally dielectric multilayer mirrors can in practice be quite high putting a practical limit on the amount of comb lines and hence laser power that can be transmitted through a resonant cavity by locking. Also a large number of comb lines can in itself cause an issue with sensitivity, as the optical power per comb line is reduced in direct proportion to the number of comb lines causing a reduction in power per line.

As an alternative to dispersive or FTIR resolution of individual comb lines an alternative technique, described in detail later, which uses the interference of two similar combs with slightly differing centre frequencies and FSR, can be used to probe individual comb lines for absorption by using the RF beat frequencies. Here again a reduction in the number of comb lines from 1,000 plus from a mode locked comb source to the 10-50 of the invention can be a distinct advantage as the complexity of the RF spectrum, and the possibility of aliasing (where two RF beats overlap or are very similar) will increase as a direct proportion to the number of comb lines. The number of comb lines generated is limited, particularly in the 5-30 GHz FSR range which correspond to reasonable resonator cavity lengths (30-5 cm), increasing the power in each comb line which can be further boosted by use of an EDFA.

One further difficulty in mode locked produced frequency comb is that adjustments to the FSR, the range of FSRs available and the centre wavelength are limited and require mechanical movement. Most prior-art frequency combs are based on mode locking long cavity lasers or the use of amplifying fibres. In either cases adjustments to the FSR are mechanical by physically changing the cavity length. This is slow, subject to mechanical tolerances and has a very limited range of FSR. In US2008/0074600 the use of matching an optical comb source to a high finesse cavity is discussed. In this case the optical comb source which is a mode locked source is matched to the etalon by dithering of the cavity length. Similar constraints apply to the centre wavelength. The invention overcomes these limitations by having a widely tuneable FSR allowing locking on a large range of cavities and molecular spectral resonances. Also mechanical adjustments are replaced by electrical changes so that instabilities in the cavity caused by slower mechanical changes, caused by thermal or vibrational instabilities, can be tracked with a fast response time.

Prior art mode locked frequency comb sources such as the pico-second mode locked Ti sapphire laser are comparatively bulky, require a large power consumption and have a number of high tolerance mechanical and optical parts required for construction. Some applications of high sensitivity gas detection such as remote checking of greenhouse gas concentrations and gas monitoring of power turbines require a small solution, insensitive to vibrations and with low power consumption. These issues in prior art are addressed by the current invention where comb sources can be produced in a very small footprint and power-consumption limited to about 50 Watts.

Prior art frequency combs are limited in wavelength limiting the amount of molecules that can be examined. Individual directly modulated laser diodes tend to have a large gain peak allowing the one comb source to track and lock-on to a number of molecular species. Also semiconductor lasers that can be directly modulated are currently available from about 380 nm in the UV (GaN) to tens of microns in the Infra-Red.

An embodiment of the invention including a resonant cavity is shown in FIG. 16.

The resonant cavity is used as a multipass cell and a selective filter, only allowing frequencies that correspond to the FSR of the resonant cavity pass (multiple times) and rejecting all others. The apparatus uses a resonant cavity containing a gaseous species and matches the FSR of the comb to whole multiple or whole fraction of the resonant cavity FSR. A central frequency of the comb is scanned to match the central frequency of the resonant cavity and the detection of the intensity of the comb lines with a dispersive element such as an FTIR spectrometer.

In this example the apparatus is used to determine the concentration of a target gas that is within the resonant cavity. A gain-switched frequency comb is produced by the method discussed above 16.1 this is passed through a collimator 16.2 and is transmitted through a resonant cavity 16.3 which contains an unknown concentration of a gaseous species such as $CO_2$, in the presence of other gasses. The resonant cavity has two highly reflective mirrors which cause a partial reflection of each laser pulse which increases the interaction length of the laser pulse within the cavity. A piezoelectric transducer 16.4 is moved so that the central wavelength of the frequency comb corresponds to the wavelengths of interest. The comb source central frequency is then set and locked on the central frequency and the comb spacing so that it corresponds to the resonant cavity FSR, or a whole multiple thereof, or a whole fraction thereof. The procedure of locking the comb source onto the cavity will be familiar to a person skilled in the art and can be automated. In this case the cavity will only transmit the comb lines, or in the case of a whole multiple alternate evenly spaced lines. Also the resonance of the comb lines will increase the interaction length of the laser beam in the cavity leading to significant increase in sensitivity. After the comb lines have been passed through the cavity to the focusing lens 16.5 their absorption can be determined by passing through a dispersive element 16.7 such as an FTIR for separation of the comb lines. A reference comb can be passed through a reference fibre 16.6 for comparison so that a direct calculation of absorption can take place.

In another embodiment of the invention the dispersive element 16.7 can be replaced by a photo-detector and the emission comb and the FSR of the cavity can be set to a multiple of the gaseous molecular absorption bands. For example as shown in FIG. 11, the absorption bands around 1.572 µm are spaced at 38.972 GHz. As in the previous embodiment we can set the frequency of the comb to 19.486 GHz. Furthermore we can set the FSR of the resonant cavity to 2.4358 GHz, a whole fraction of the comb frequency. This corresponds to a cavity length of 61.54 mm. In this case if 99.9% mirrors are used, which are commonly available, the effective optical path length of the comb lines, which correspond to one in every four cavity lines, is 61.54 meters. For parts per billion accuracy path lengths of this magnitude are desirable. In FIGS. 8 and 9 the effect of moving the comb central wavelength by half a comb FSR is shown. In one case the comb lines sit within the low absorption peaks and in the other case every second comb line is largely on or close to the absorption peaks which have a much wider line width than the comb lines. So by moving the comb central wavelength by half an FSR and re-locking the comb to the cavity two power measurements can be made in a comparatively fast and to a high degree of accuracy.

In another embodiment of the invention the comb FSR can be set to a lower frequency multiple than the cavity FSR.

For example in FIG. 17 a frequency comb consisting of a multitude of comb lines with an FSR of 500 MHz is shown. If the resolution of the dispersive analyser 16.7 is limited to say 2 GHz then the addition of the resonant cavity can be used to select a whole multiple of the finely spaced comb lines not transmitting the lines in between. For example the cavity FSR can be set to 2.5 GHz corresponding to an Etalon spacing of 6 cm. In this case the etalon can be set so that it will select one in every five comb lines and then move on to the next line at five spacing and progressively lines 3 and 4 to complete the cycle. The dispersive analyser will then be presented with comb spacing of 2.5 GHz that it should have no difficulty in resolving. These can be stepped by 500 MHz spacing to resolve the lines in between the first lines. For further resolution the central wavelength of the etalon can be dithered to get spectral readings between lines. Also the frequency comb spacing can be decreased in whole fractions of the etalon FSR in order to introduce more steps or finer resolution. The ultimate resolution of this spectrometer is limited by the line width of the comb lines which can be as low as 300 KHz. Another advantage of this embodiment is that if used for gas analysis with a 6 cm cavity, for example, and 99.97% mirrors which are available, the effective path length in the gas is 200 m for a small footprint cavity.

Hence the resolution of the spectrometer, which was already at the limit of most commercial FTIR analysers, has been improved by many orders of magnitude and the optical path length has been increased to one fifth of a kilometre by the addition of a comb source and etalon resonator. The numbers given are for example only and many configurations of etalons can be used depending on the application, speed of acquisition and sensitivity required. This combination of resolution and optical path length can improve the sensitivity of a spectroscopic gas detection system by several orders of magnitude. Also if the etalon does not contain an absorbing species this spectrometer can be used on solid or liquid light samples as these can be placed after the etalon and their absorption or reflection monitored. It also has applications for coherent Raman spectroscopy as in the time domain it is in effect an optical pulse.

In a high finesse cavity the effective light path can be of the order of kilometres or greater. In this case the cavity will store optical light and the leakage of the light out of cavity from resonating comb lines is a function of leakage from the mirrors and absorption. The prior art technique can be used to measure absorption by looking at the decay time of this light in the cavity after the source is switched off. This prior art is discussed in detail in references including US2008/0074660.

In this embodiment a gain switched laser diode optical comb source as described is used with a high finesse cavity and a fast detector or dispersive detector used to monitor the decay time of a comb line or lines after the source is switched off. The use of this source has a number of advantages over other prior art comb sources used for this technique. These are:

A) fewer higher power comb lines, resulting in easier detection techniques and higher powers for individual comb lines boosting sensitivity,
B) Simple adjustment of central frequency and FSR over a wide range making locking on to a cavity faster and a wide range of etalon lengths can be accommodated,
C) Small rugged and compact solution requiring drive electronics and no moving parts, apart from an etalon piezoelectric transducer which may be required for wavelength scanning.

In another embodiment of the invention two combs can be generated from master lasers and two slaves as shown in FIG. 20. In this embodiment precise control of the frequency comb structure can be used to simultaneously interrogate a multitude of molecular levels to get a fast and accurate measurement. Interference between the two combs is used to generate a radio frequency spectrum by interference of two combs, as optical lines which are close to each other in frequency will generate a beat tone that can detected by taking a Fourier transform of the digitised output from a detector. The radio frequency spectrum generated can be interrogated to allow simultaneous detection of a plurality of comb lines without the need for a dispersive element to separate the comb lines There is substantial prior art about the use of dual comb spectroscopy with mode locked lasers for high sensitivity gas detection and also about the combination of these with a resonant cavity. The use of a gain switched laser diode frequency comb for dual comb spectroscopy has a number of advantages over these prior art methods as they are generally about the use of mode locked frequency combs. The advantages are:

A, fewer higher power comb lines making analysis of the radio frequency spectrum simpler and the improving the sensitivity B, the ability to vary the number of comb lines by varying the FSR to look to resolve fine detail after a broad sweep is an advantage. For example a spectral line indicating the presence of a gas could be identified during a broad sweep at 10 GHz FSR and then the FSR reduced to look at the line shape in detail at 500 MHz.

C, the ability to simply change the centre wavelength of the comb to match the spectral features of the target gas, D, the ability to alter the FSR over a wide range to match a resonant cavity and/or the absorption bands and vibrational states of a target species, and E, wide wavelength range of laser diodes available from UV to infrared [F] Robust, small footprint and low power consumption of the laser diode comb source.

This embodiment is shown in FIG. 20. The first comb, comb A 20.1, can be set at a centre frequency close to the spectral feature of interest by setting the centre frequency ($f_0$) of the master lasers 20.3. The FSR of the comb can be adjusted to the optimum, taking into account that a smaller FSR will lead to more lines but lower single comb line power, and a higher density of comb lines will lead to a faster acquisition time and more spectral detail in a single measurement. It may also be desirable to match the FSR to the cavity FSR, or a harmonic of the cavity, if a resonant cavity, as described previously is used. The FSR can be adjusted for comb A by adjusting the frequency, $\mu_c$, of the RF generator. The centre frequency of the second comb source B 20.2 is adjusted from $f_0$ by the addition of a phase modulator 20.4 and is increased by $f_s$, the RF generator attached to the phase modulator. For simplicity $f_s$ can be set to one quarter of the FSR to maximise the number of comb lines that can be recovered before aliasing occurs, but this is for example only and in practice other ratios can be chosen. The FSR of the second comb can be set to $\mu_c+\delta f$ a slight increase in FSR by altering the frequency of the RF source on the phase modulator for Comb source B. The size of $\delta f$ will depend on the number of comb lines to be resolved and the resolution of the RF spectrum after digitizing and FFT analysis. The separation of the lines after the FFT analysis will be given by $\delta f$. Comb A is passed through an optical splitter 20.6 to two paths, one to supply a reference and the other is collimated through a lens, or combination of lenses through a multi-pass cell which may contain unknown concentrations of the target gaseous species. The multi-pass cell can be replaced with a resonant cavity. Similarly Comb source B is passed through an optical splitter 20.5 to a reference and sample beam. These two paths are combined with optical combiners 20.7 and 20.8 so that they interfere with comb source A. By comparison of the reference and signal beat spectra the amount of attenuation of the comb lines that have passed through the gas cell can be determined. Both the reference and signal paths are incident on fast photodetectors 20.11 and 20.12 and the output from these is digitized by a digitizer 20.13. This data can then be analysed by the fast Fourier transform method in a PC or FPGA 20.14 to generate a power spectrum of the RF beats. The resolution of the RF beat spectrum will allow the resolution of the individual comb lines.

In FIGS. 18 and 19 the dual comb spectroscopy is explained in detail by reference to an example. In this case a comb spectrum A is set to 190.5200 THz, close to an absorption band of $CO_2$ and with an FSR of 50 GHz. Comb B is set with a centre frequency of 190.52 THz+12.5 GHz (one quarter of the FSR) by adjusting $f_s$ the phase modulator frequency. Comb B FSR is set to 50 GHz+1.25 GHz so that $\delta f$ is 1.25 GHz. The resulting comb spectra A and B are shown in FIG. 18. When the two combs are combined as shown in the next spectra the close spectral lines will interfere to cause an RF beat spectra as shown in the final spectra in FIG. 19. In the region of interest as shown there will be an RF spectrum from 8 to 20 GHz and the power of each line will be directly proportional to the intensity of comb source A comb lines and these lines will be modulated by the absorption of the gas. The RF beat lines will be separated by 1.25 GHz or $\delta f$. A reference spectrum can be taken, where the comb A does not pass through the gas cell for comparison as shown in FIG. 20 and the absorption spectrum calculated. In practice a 50 GHz FSR would be difficult to achieve and a smaller FSR would be used and fs and $\delta f$ scaled accordingly and this example is for illustration only and the larger FSR spacing for sake of clarity in the FIGS. 18 and 19 is for illustration only. Once a scan has been completed at a larger FSR then the FSR can be reduced to say 500 MHz and a detailed spectrum of an absorption line can be obtained.

In another embodiment of the invention a single comb, as described, which in effect is a train of pulses in the time domain, can be split in two as and the gap between the pulses varied. In this case the first laser pulse causes chemical bonds in the molecule to vibrate and causes a change in the refractive index of the sample to vary periodically. The energy from this vibration causes a shift in the wavelength of the second pulse that can be probed as a function of delay of the second pulse train. As each type of molecule has a distinct signature of vibration frequencies by looking at the beat spectrum the presence and concentration of different molecules can be determined. In this case the method can be used on semi-transparent and solid samples for example microscopy where it can be used to identify a particular species. This prior art technique is known as Coherent anti-Stokes Raman spectroscopy.

In another embodiment of the invention a single tuneable comb source as described can be used to probe the emission spectrum of an astronomical observation of emission lines, or absorption gaps, or from a plasma source and accurately determine red-shifts or other spectral measurements as required. In this case the RF frequency between a calibrated comb and the emission source which can consist of a plurality of emission lines or gaps can be interrogated by mixing the source and the comb on a high speed photodetector, digitizing and applying a fast Fourier transform to the data. This has many applications from plasma based material processing to astronomical observations.

The invention is not limited to the embodiments described but may be varied in construction and detail. For example it is not necessary for all embodiments that the comb is generated by gain switching a diode. Various aspects of the invention could be performed with other comb sources.

The invention claimed is:
1. A method of performing spectroscopy, the method comprising:
providing an injection locked gain switched optical frequency comb using a gain-switched laser diode driven with a radio frequency (RF) signal, wherein the injection locked gain switched optical frequency comb is provided by using the gain-switched laser diode to injection lock the injection locked gain switched optical frequency comb;
reconfiguring comb spacing of the injection locked gain switched optical frequency comb by altering frequency of the RF signal;
directing the injection locked gain switched optical frequency comb through or at a sample;
obtaining spectroscopic measurements representative of interaction of one or more comb lines in the injection locked gain switched optical frequency comb with the sample;
adjusting center frequency of the injection locked gain switched optical frequency comb to a known absorption band or gap;
adjusting a comb source to cause one or more comb lines to interact with molecular absorption bands of the molecule;
determining distances to absorption peaks by monitoring changes in transmission; and
determining presence of a molecule and its relative concentration based on the distances to the absorption peaks.
2. The method of claim 1, wherein the optical frequency comb is generated by gain switching a laser diode.
3. The method of claim 2, wherein the laser diode is constructed from Gallium Nitride and related materials.
4. The method of claim 2, and further comprising:
performing spectroscopic detection in blue, green and ultra-violet regions of the electromagnetic spectrum.
5. The method of claim 2, and further comprising:
performing spectroscopic detection in green, yellow, red and near infra-red regions of the electromagnetic spectrum,
wherein the laser diode is constructed from Gallium Arsenide (GaAs), or Aluminum Gallium Arsenide (AlGaAs), or Aluminum Indium Gallium Phosphide (AlInGaP), or Indium Phosphide (InP), or Gallium Indium Arsenide Phosphide (GaInAsP) or a combination of these materials.
6. The method of claim 2, and further comprising:
performing spectroscopic detection in near infra-red and infra-red regions of the electromagnetic spectrum,
wherein the laser diode, is constructed with quantum wells made from InGaAs, strained or otherwise in the active region.
7. The method of claim 2, and further comprising:
performing spectroscopic detection in an infra-red region of the electromagnetic spectrum, wherein the laser diode is constructed with Gallium Indium Arsenide Antimonide (GaInAsSb) or related materials.
8. The method of claim 2, and further comprising:
performing spectroscopic detection in infra-red and far infra-red regions of the electromagnetic spectrum, wherein the laser diode is constructed as a quantum cascade laser.

9. The method of claim 1, and further comprising:
obtaining direct absorption spectral measurements that are dispersed by a diffractive element.
10. The method of claim 1, wherein comb lines are passed through a sample and are then spatially fanned out in wavelength or frequency before being monitored by a CCD array or separated by an optical spectrum analyzer or Fourier transform spectrometer.
11. The method of claim 1, wherein comb lines are passed through a sample and are then spatially fanned out in wavelength or frequency before being monitored by a CCD array or separated by a device such as an optical spectrum analyzer or Fourier transform spectrometer and the optical frequency comb is used with a multi-pass cell that contains a gaseous sample of known molecular absorption spectrum and the comb is used to interrogate molecular absorption lines and by using a dispersive diffractive element to determine concentration or pressure of a gaseous species.
12. The method of claim 1, wherein an emission comb is set to approximate an absorption comb or a multiple of the absorption comb so that the emission comb is provided in gaps between absorption bands and limits absorption by an incident comb.
13. The method of claim 12, wherein the incident comb is moved to a position where a number of comb lines interact with the absorption bands, and wherein the comb experiences a large absorption when passing through the sample.
14. The method of claim 1, wherein a center wavelength of an incident comb is moved such that some or all of comb lines interact with the gaps between absorption bands, or the center wavelength absorption position is moved such that some or all of the comb lines are absorbed by a molecule whereby a comparison of transmissions can then be made to determine concentration and presence of a molecular species.
15. The method of claim 1, and further comprising:
modifying the injection locked gain switched optical frequency comb to modify a free spectral range (FSR), or a whole multiple thereof, to match frequency separation of two or more molecular absorption bands at the center wavelength of the injection locked gain switched optical frequency comb, or
modifying the FSR such that some or all comb lines interact with absorption bands of a molecule, whereby a comparison of transmissions can then be made to determine concentration and presence of a molecular species.
16. The method of claim 1, and further comprising:
providing a comb source with a free spectral range (FSR), and a fixed multiple (N) of the FSR that defines a filter characteristic of a resonant cavity operable to increase resolution of a spectrophotometer; and
repetitively, until a complete entire spectrum is constructed:
tuning the resonant cavity to select every Nth comb line produced by the comb source;
providing the every Nth comb lines to a spectrometer; and
incrementing the value of N.
17. The method of claim 16, wherein the resonant cavity contains a gaseous species, further comprising:
matching the FSR of the injection locked gain switched optical frequency comb to whole multiple or whole fraction of the resonant cavity FSR, wherein a central frequency of the injection locked gain switched optical frequency comb is scanned to match the central frequency of the resonant cavity and detection of intensity of the comb lines using a Fourier Transform Infrared (FTIR) spectrometer as a dispersive element.

18. The method of claim 16, wherein the optical frequency comb uses a resonant cavity that may or may not contain a gaseous species and uses a resonant cavity to transmit one in every N comb lines, where N is a whole number, to read intensity of each of the transmitted comb lines using a dispersive element.

19. The method of claim 16, comprising the step of causing the center wavelength of the resonant cavity to move to another set of adjoining comb lines using a transducer.

20. The method of claim 16, wherein a time resolved transmission or reflection spectrum is resolved and ultimate resolution of a spectrophotometer is improved by a factor of N limited by the resolution of the comb line.

21. The method of claim 16, and further comprising:
monitoring decay of comb lines after the comb source is switched off; and
determining optical absorption within the resonant cavity based on the monitoring the decay of the comb lines,
wherein the optical frequency uses a high finesse optical cavity that acts as a storage device for optical radiation.

22. The method of claim 1, and further comprising:
using two optical frequency combs;
mixing the two optical frequency combs on a detector to create a radio frequency (RF) beat frequency; and
interrogating an RF spectrum to determine absorption or transmission of comb lines.

23. The method of claim 1, and further comprising:
using the optical frequency comb for coherent anti-Stokes Raman spectroscopy.

24. The method of claim 1, and further comprising:
using the optical frequency comb to probe emitted spectral lines from a Plasma or other source by using an RF beat frequency.

25. The method of claim 1, and further comprising:
using the optical frequency comb to probe emitted spectral lines from an astronomical source to examine red-shifts.

26. The method of claim 1, further comprising:
seeding the gain-switched laser diode with light from a single mode laser while driving the gain-switched laser diode with a direct current (DC) bias.

27. An apparatus for performing spectroscopy, the apparatus comprising:
an optical frequency comb source configured to provide an optical frequency comb,
an element configurable to direct the optical frequency comb through or at a sample,
a gain-switched laser diode that is driven with a radio frequency (RF) signal,
wherein the comb source uses the gain-switched laser diode to injection lock the optical frequency comb, thereby providing an injection locked gain switched optical frequency comb,
wherein a comb spacing of the injection locked gain switched optical frequency comb is reconfigured by altering frequency of the RF signal, and
wherein spectroscopic measurements representative of interaction of one or more comb lines in the injection locked gain switched optical frequency comb with the sample are obtained when the injection locked gain switched optical frequency comb is directed through or at the sample, and
a controller configured to:
adjust center frequency of the injection locked gain switched optical frequency comb to a known absorption band or gap;
adjust a comb source to cause one or more comb lines to interact with molecular absorption bands of the molecule;
determine distances to absorption peaks by monitoring changes in transmission; and
determine presence of a molecule and its relative concentration based on the distances to the absorption peaks.

28. The apparatus of claim 27, and further comprising:
a diffractive element configurable to direct the comb through or at the sample,
a detector for monitoring radiation from the sample,
a controller adapted to control or configure the comb source or the diffractive element.

29. The apparatus of claim 28, wherein the gain switched laser diode is constructed from Gallium Nitride and related materials.

30. The apparatus of claim 28, wherein the gain switched laser diode is constructed from Gallium Arsenide (GaAs), or Aluminum Gallium Arsenide (AlGaAs), or Aluminum Indium Gallium Phosphide (AlInGaP), or Indium Phosphide (InP), or Gallium Indium Arsenide Phosphide (GaInAsP) or a combination of these materials, and wherein spectroscopic detection is performed in green, yellow, red and near infrared regions of the electromagnetic spectrum.

31. The apparatus of claim 28, wherein the gain switched laser diode, is constructed with quantum wells made from Indium Gallium Arsenide (InGaAs), strained or otherwise in an active region, and wherein spectroscopic detection is performed in near infra-red and infra-red regions of the electromagnetic spectrum.

32. The apparatus of claim 28, wherein the gain switched laser diode is constructed with Gallium Indium Arsenide Antimonide (GaInAsSb) or related materials, and wherein spectroscopic detection is performed in an infra-red region of the electromagnetic spectrum.

33. The apparatus of claim 28, wherein the gain switched laser diode is constructed as a quantum cascade laser, and wherein spectroscopic detection is performed in infra-red and far infra-red regions of the electromagnetic spectrum.

34. The apparatus of claim 27, and further comprising:
a grating adapted to disperse a spectrum, wherein the dispersed spectrum is used to obtain direct absorption spectral measurements.

35. The apparatus of claim 27, and further comprising:
means for spatially fanning out in wavelength or frequency a comb before the comb is monitored by a detector for monitoring radiation from the sample.

36. The apparatus of claim 27, wherein the optical frequency comb source comprises a resonant cavity containing a gaseous species and means for matching of a free spectral range (FSR) of the injection locked gain switched optical frequency comb to a whole multiple or whole fraction of the FSR of the resonant cavity, and further comprising:
a piezo-electric element configured to move a central frequency of the injection locked gain switched optical frequency comb to match the central frequency of the resonant cavity and detect the intensity of the comb lines, wherein a Fourier Transform Infrared (FTIR) spectrometer configured as a dispersive element is used to detect the intensity of the comb lines.

37. The apparatus of claim 27, and further comprising:
a piezo-electric element configured to cause the center wavelength of a resonant cavity to move to another set of adjoining comb lines.

38. The apparatus of claim 37, and further comprising:
a high finesse optical cavity that acts a storage device for optical radiation; and
instrumentation configured to monitor decay of the comb lines after the source is switched off, and to determine optical absorption within the cavity.

39. The apparatus of claim 27, and further comprising:
at least two optical frequency combs; and
means for mixing the combs on a detector to create a RF beat frequency, wherein
the detector is configured to interrogate an RF spectrum to determine absorption or transmission of comb lines.

40. The apparatus of claim 27, further comprising:
a controller that is adapted to configure the injection locked gain switched optical frequency comb for coherent anti-Stokes Raman spectroscopy.

41. The apparatus of claim 27, further comprising:
a controller that is adapted to cause the injection locked gain switched optical frequency comb to probe emitted spectral lines from a plasma device or other source by using an RF beat frequency.

42. The apparatus of claim 27, further comprising:
a controller that is adapted to configure the optical frequency comb to probe emitted spectral lines from an astronomical source to examine red-shifts.

43. The apparatus of claim 27, wherein a direct current (DC) bias is applied to the RF signal that drives the gain-switched laser diode.

* * * * *